(12) United States Patent
Hayashi

(10) Patent No.: US 7,638,257 B2
(45) Date of Patent: Dec. 29, 2009

(54) POSITIVE RESIST COMPOSITION AND METHOD OF FORMING RESIST PATTERN

(75) Inventor: Ryotaro Hayashi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 488 days.

(21) Appl. No.: 11/576,687

(22) PCT Filed: Oct. 4, 2005

(86) PCT No.: PCT/JP2005/018382

§ 371 (c)(1),
(2), (4) Date: Apr. 4, 2007

(87) PCT Pub. No.: WO2006/038635

PCT Pub. Date: Apr. 13, 2006

(65) Prior Publication Data

US 2009/0263741 A1    Oct. 22, 2009

(30) Foreign Application Priority Data

Oct. 7, 2004   (JP) .............................. 2004-295150

(51) Int. Cl.
*G03F 7/004* (2006.01)
*G03F 7/30* (2006.01)

(52) U.S. Cl. ..................... 430/270.1; 430/326; 430/330; 430/905; 430/910

(58) Field of Classification Search ............... 430/270.1, 430/326, 330, 905, 910
See application file for complete search history.

(56) References Cited

U.S. PATENT DOCUMENTS

| | | | |
|---|---|---|---|
| 6,479,211 B1 | 11/2002 | Sato et al. | |
| 6,627,381 B1 * | 9/2003 | Uetani et al. | 430/270.1 |
| 6,753,126 B2 | 6/2004 | Park et al. | |
| 2003/0219680 A1 | 11/2003 | Nishimura et al. | |
| 2004/0058269 A1 | 3/2004 | Hada et al. | |

FOREIGN PATENT DOCUMENTS

| | | |
|---|---|---|
| JP | 08-101509 | 4/1996 |
| JP | 2001-318465 | 11/2001 |
| JP | 2002-363225 | 12/2002 |
| JP | 2003-122007 | 4/2003 |
| JP | 2003-287884 | 10/2003 |

OTHER PUBLICATIONS

International Search Report from PCT/JP2005/018382 dated Nov. 15, 2005.
Combined Office Action and Search Report issued on May 6, 2008, on the counterpart Taiwanese Patent Application No. 094134357.

* cited by examiner

*Primary Examiner*—John S Chu
(74) *Attorney, Agent, or Firm*—Knobbe, Martens, Olson & Bear, LLP

(57) ABSTRACT

A positive resist composition that includes a resin component (A) and an acid generator component (B), wherein the component (A) includes a polymer compound (A1) having a structural unit (a0) represented by a general formula (a0) shown below, and a structural unit (a1), which is derived from an (α-lower alkyl) acrylate ester containing an acid-dissociable, dissolution-inhibiting group and is not classified as the structural unit (a0):

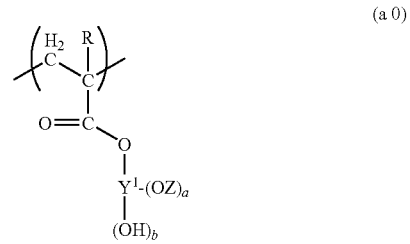

(a0)

(wherein, R represents a hydrogen atom or a lower alkyl group; $Y^1$ represents an aliphatic cyclic group; Z represents an alkoxyalkyl group; a represents an integer from 1 to 3, and b represents either 0 or an integer from 1 to 2, provided that a+b=1 to 3).

8 Claims, No Drawings

POSITIVE RESIST COMPOSITION AND METHOD OF FORMING RESIST PATTERN

RELATED APPLICATIONS

This application is the U.S. National Phase filing under 35 U.S.C. §371 of PCT/JP2005/018382, filed Oct. 4, 2005, which designated the United States and was published in a language other than English, which claims priority under 35 U.S.C. §119(a)-(d) to Japanese Patent Application No. 2004-295150, filed Oct. 7, 2004. The content of these applications is incorporated herein by reference in their entireties.

TECHNICAL FIELD

The present invention relates to a positive resist composition and a method of forming a resist pattern.

BACKGROUND ART

In recent years, in the production of semiconductor elements and liquid crystal display elements, advances in lithography techniques have lead to rapid progress in the field of miniaturization of a pattern. Typically, these miniaturization techniques involve shortening the wavelength of the exposure light source. Conventionally, ultraviolet radiation typified by g-line and i-line radiation has been used, but nowadays, mass production of semiconductor elements using KrF excimer lasers and ArF excimer lasers has commenced. Furthermore, investigations are also being conducted into the use of radiation with even shorter wavelengths than these excimer lasers, including $F_2$ excimer lasers, electron beams, extreme ultraviolet radiation, and X-rays.

One example of a known resist material that satisfies the high resolution properties necessary for reproducing patterns of minute dimensions is a chemically amplified resist composition, which includes a base resin that undergoes a change in alkali solubility under the action of acid, and an acid generator that generates acid on exposure. These chemically amplified resist compositions include negative compositions that contain an alkali-soluble resin, an acid generator and a cross-linking agent, and positive compositions that contain a resin that exhibits increased alkali solubility under the action of acid, and an acid generator.

For example, resins (acrylic resins) containing structural units derived from (meth)acrylic acid are widely used as the base resin for resists used within ArF excimer laser lithography as they offer excellent transparency in the vicinity of 193 nm (see patent reference 1).

[Patent Reference 1]

Japanese Unexamined Patent Application, First Publication No. 2003-167347

DISCLOSURE OF INVENTION

In recent years, as the demands for higher resolution have increased, reducing the level of line width roughness (hereafter abbreviated as LWR), which describes non-uniformity within the line width of a line pattern, has become an increasingly important issue. However, conventional chemically amplified positive resist compositions are unable to provide satisfactory improvements in the level of LWR.

The present invention addresses the circumstances described above, with an object of providing a positive resist composition and a method of forming a resist pattern that are capable of reducing the level of LWR.

In order to achieve the object described above, the present invention provides the aspects described below.

A first aspect is a positive resist composition, including a resin component (A) that exhibits changed alkali solubility under the action of acid, and an acid generator component (B), wherein the component (A) includes a polymer compound (A1) having a structural unit (a0) represented by a general formula (a0) shown below, and a structural unit (a1), which is derived from an (α-lower alkyl) acrylate ester containing an acid-dissociable, dissolution-inhibiting group and is not classified as the structural unit (a0).

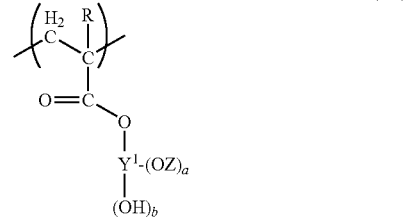

(wherein, R represents a hydrogen atom or a lower alkyl group; $Y^1$ represents an aliphatic cyclic group; Z represents an alkoxyalkyl group; a represents an integer from 1 to 3, and b represents either 0 or an integer from 1 to 2, provided that a+b=1 to 3)

A second aspect is a method of forming a resist pattern that includes applying a positive resist composition according to the first aspect to a substrate, conducting a prebake, performing selective exposure, conducting PEB (post exposure baking), and performing alkali developing to form the resist pattern.

In the present invention, a positive resist composition and a method of forming a resist pattern that are capable of reducing the level of LWR are obtained.

BEST MODE FOR CARRYING OUT THE INVENTION

Positive Resist Composition

A positive resist composition of the present invention includes a resin component (A) that exhibits changed alkali solubility under the action of acid, and an acid generator component (B), wherein the component (A) includes a polymer compound (A1) having a structural unit (a0) represented by the general formula (a0) shown above, and a structural unit (a1), which is derived from an (α-lower alkyl) acrylate ester containing an acid-dissociable, dissolution-inhibiting group and is not classified as the structural unit (a0).

In this positive resist composition, when acid is generated from the component (B) upon exposure, the acid causes the acid-dissociable, dissolution-inhibiting groups within the component (A) to dissociate, thereby increasing the alkali solubility. As a result, when the resist composition applied to the surface of a substrate is selectively exposed during the formation of a resist pattern, the alkali solubility of the exposed portions increases, meaning alkali developing can then be conducted.

<Component (A)>

The component (A) must include the polymer compound (A1).

The polymer compound (A1) may be either a single compound, or a combination of two or more different compounds.

In order to achieve favorable effects for the present invention, the proportion of the polymer compound (A1) within the component (A) is preferably at least 50% by weight, even more preferably within a range from 80 to 100% by weight, and is most preferably 100% by weight.

The polymer compound (A1) must contain the structural unit (a0) and the structural unit (a1).

Structural Unit (a0)

The structural unit (a0) is represented by the general formula (a0) shown above.

In the general formula (a0), R represents a hydrogen atom or a lower alkyl group. A lower alkyl group refers to an alkyl group of 1 to 5 carbon atoms, and specific examples include straight-chain and branched groups such as a methyl group, ethyl group, propyl group, isopropyl group, n-butyl group, isobutyl group, tert-butyl group, pentyl group, isopentyl group and neopentyl group. From the viewpoint of industrial availability, R is preferably either a hydrogen atom or a methyl group. Moreover, the hydrogen atom, or any of the hydrogen atoms of the lower alkyl group represented by R may be substituted with a fluorine atom.

$Y^1$ represents an aliphatic cyclic group.

The expression "aliphatic cyclic group" refers to a monocyclic group or polycyclic group that contains no aromaticity.

This "aliphatic cyclic group" may either contain, or not contain, substituent groups.

Examples of suitable substituent groups include lower alkyl groups of 1 to 5 carbon atoms, a fluorine atom, fluorinated lower alkyl groups of 1 to 5 carbon atoms that have undergone substitution with a fluorine atom, and an oxygen atom (=O) and the like.

The basic ring structure of the "aliphatic cyclic group" excluding substituent groups is not restricted to groups formed solely from carbon and hydrogen (hydrocarbon groups), although a hydrocarbon group is preferred. Furthermore, the "hydrocarbon group" may be either saturated or unsaturated, but is preferably saturated. A polycyclic group is particularly desirable.

Specific examples of this type of aliphatic cyclic group include groups in which two or more hydrogen atoms have been removed from a monocycloalkane or a polycycloalkane such as bicycloalkane, tricycloalkane or tetracycloalkane, which may, or may not, be substituted with a fluorine atom or a fluorinated alkyl group. Specific examples of suitable groups include groups in which two or more hydrogen atoms have been removed from a monocycloalkane such as cyclopentane or cyclohexane, or a polycycloalkane such as adamantane, norbornane, isobornane, tricyclodecane or tetracyclododecane. Of these, groups in which two or more hydrogen atoms have been removed from adamantane are preferred.

Z represents an alkoxyalkyl group.

Z functions as an acid-dissociable, dissolution-inhibiting group.

A wide variety of acid-dissociable, dissolution-inhibiting groups have been used within chemically amplified positive resist compositions, and Z represents one of these groups.

In the structural unit (a0), the action of the acid generated from the component (B) causes the bond between the Z group and the adjacent oxygen atom to break, thereby enabling the solubility of the polymer compound (A1) in alkali developing solutions to be increased.

Amongst the various alkoxyalkyl groups, groups represented by a general formula shown below are preferred.

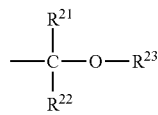

(wherein, $R^{21}$ and $R^{22}$ each represent, independently, a lower alkyl group or a hydrogen atom, and $R^{23}$ represents an alkyl group or a cycloalkyl group. Furthermore, $R^{21}$ and $R^{23}$ may be bonded together at their respective terminals to form a ring)

The number of carbon atoms within a lower alkyl group of the groups $R^{21}$ and $R^{22}$ is preferably from 1 to 15 (and even more preferably from 1 to 4), and the group may be either a straight-chain or branched-chain group, although an ethyl group or methyl group is preferred, and a methyl group is the most desirable. Those cases in which one of the groups $R^{21}$ and $R^{22}$ is a hydrogen atom and the other is a methyl group are particularly desirable.

$R^{23}$ is an alkyl group or a cycloalkyl group, the number of carbon atoms within the group is preferably from 1 to 15, and the group may be a straight-chain, branched-chain or cyclic group. In those cases where $R^{23}$ is a straight-chain or branched-chain group, the number of carbon atoms is preferably from 1 to 5, an ethyl group or methyl group is preferred, and an ethyl group is particularly desirable.

In those cases where $R^{23}$ is a cyclic group, the number of carbon atoms is preferably from 4 to 15, even more preferably from 4 to 12, and is most preferably from 5 to 10. Specific examples of this type of cyclic group include groups in which one or more hydrogen atoms have been removed from a monocycloalkane or a polycycloalkane such as bicycloalkane, tricycloalkane or tetracycloalkane, which may, or may not, be substituted with a fluorine atom or a fluorinated alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane. Of these, groups in which one or more hydrogen atoms have been removed from adamantane are particularly desirable.

Furthermore, in the above formula, $R^{21}$ and $R^{23}$ may each represent independent alkylene groups of 1 to 5 carbon atoms, wherein the terminal of $R^{23}$ and the terminal of $R^{21}$ are bonded together.

In such cases, a cyclic group is formed from the groups $R^{21}$ and $R^{23}$, the oxygen atom bonded to $R^{23}$, and the carbon atom that is bonded to this oxygen atom and the group $R^{21}$. This type of cyclic group is preferably a 4- to 7-membered ring, and 4- to 6-membered rings are even more desirable. Specific examples of these cyclic groups include a tetrahydropyranyl group and a tetrahydrofuranyl group.

In the general formula (a0), a represents an integer from 1 to 3, and is most preferably 1.

Furthermore, b represents either 0 or an integer from 1 to 2, and is most preferably 0.

Furthermore, a+b=1 to 3, and is most preferably 1.

As the structural unit (a0), structural units represented by a general formula (a0-1) shown below are particularly preferred.

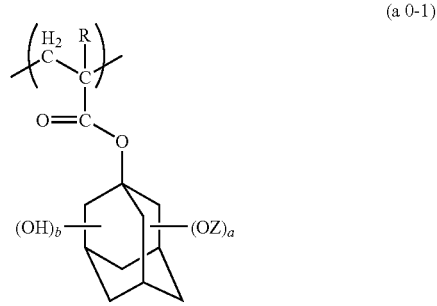

(a 0-1)

(wherein, R represents a hydrogen atom or a lower alkyl group, Z represents an alkoxyalkyl group, a represents an integer from 1 to 3, and b represents either 0 or an integer from 1 to 2, provided that a+b=1 to 3)

Preferred groups for R and preferred numbers for a and b are as described above.

The monomer that gives rise to the structural unit (a0) can be synthesized easily by using a conventional method to effect an addition of a vinyl ether such as ethyl vinyl ether to a monomer such as an (α-lower alkyl) acrylate ester that contains an aliphatic cyclic group having 1 to 3 hydroxyl groups, for example, 3-hydroxy-1-adamantyl (meth)acrylate, 3,5-dihydroxy-1-adamantyl (meth)acrylate or 3,5,7-trihydroxy-1-adamantyl (meth)acrylate, thereby introducing an alkoxyalkyl group into the monomer structure.

The structural unit (a0) may use either a single type of structural unit, or a mixture of two or more different structural units.

The proportion of the structural unit (a0), relative to the combined total of all the structural units that constitute the polymer compound (A1), is typically within a range from 10 to 60 mol %, preferably from 10 to 40 mol %, and is most preferably from 15 to 30 mol %.

Ensuring that this proportion is at least as large as the lower limit of the above range enables the effects of the present invention to be enhanced, whereas ensuring that the proportion is no greater than the upper limit enables a more favorable balance to be achieved with the other structural units.

Structural Unit (a1)

The structural unit (a1) is a structural unit which is derived from an (α-lower alkyl) acrylate ester containing an acid-dissociable, dissolution-inhibiting group, and is not classified as a structural unit (a0).

The acid-dissociable, dissolution-inhibiting group in the structural unit (a1) can use any of the groups that have been proposed as acid-dissociable, dissolution-inhibiting groups for the base resins of chemically amplified resists. Generally, groups that form either a cyclic or chain-like tertiary alkyl ester or groups that form a cyclic or chain-like alkoxyalkyl ester with the carboxyl group of the (meth)acrylate ester are the most widely known. Here, the term "(meth)acrylate ester" is a generic term that includes both the acrylate ester and the methacrylate ester.

Here, a tertiary alkyl ester describes a structure in which an ester is formed by substituting the hydrogen atom of a carboxyl group with an alkyl group or a cycloalkyl group, and a tertiary carbon atom within the alkyl group or cycloalkyl group is bonded to the oxygen atom at the terminal of the carbonyloxy group (—C(O)—O—).

In this tertiary alkyl ester, the action of acid causes cleavage of the bond between the oxygen atom and the tertiary carbon atom.

The alkyl group or cycloalkyl group may contain a substituent group.

Hereafter, for the sake of simplicity, groups that exhibit acid dissociability as a result of the formation of a tertiary alkyl ester at a carboxyl group are referred to as "tertiary alkyl ester-based acid-dissociable, dissolution-inhibiting groups".

Furthermore, a cyclic or chain-like alkoxyalkyl ester describes a structure in which an ester is formed by substituting the hydrogen atom of a carboxyl group with an alkoxyalkyl group, wherein the alkoxyalkyl group is bonded to the oxygen atom at the terminal of the carbonyloxy group (—C(O)—O—). In this alkoxyalkyl ester, the action of acid causes cleavage of the bond between the oxygen atom and the alkoxyalkyl group.

As the structural unit (a1), the use of one or more structural units selected from the group consisting of structural units represented by a general formula (a1-0-1) shown below and structural units represented by a general formula (a1-0-2) shown below is particularly preferred.

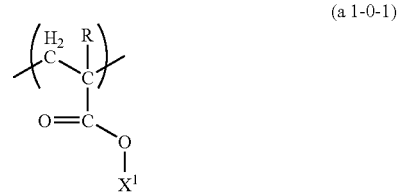

(wherein, R represents a hydrogen atom or a lower alkyl group; and $X^1$ represents an acid-dissociable, dissolution-inhibiting group)

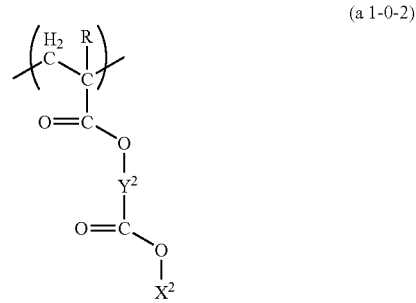

(wherein, R represents a hydrogen atom or a lower alkyl group; $X^2$ represents an acid-dissociable, dissolution-inhibiting group; and $Y^2$ represents an aliphatic cyclic group)

In the general formula (a1-0-1), R is as defined above. There are no particular restrictions on $X^1$ provided it functions as an acid-dissociable, dissolution-inhibiting group, and suitable examples include the same alkoxyalkyl groups and tertiary alkyl ester-based acid-dissociable, dissolution-inhibiting groups as those described in relation to the group Z within the structural unit (a0), and of these, tertiary alkyl ester-based acid-dissociable, dissolution-inhibiting groups are preferred.

Examples of these tertiary alkyl ester-based acid-dissociable, dissolution-inhibiting groups include aliphatic branched chain-based acid-dissociable, dissolution-inhibiting groups and acid-dissociable, dissolution-inhibiting groups that contain an aliphatic cyclic group.

Specific examples of suitable aliphatic branched chain-based acid-dissociable, dissolution-inhibiting groups include a tert-butyl group and a tert-amyl group.

Examples of acid-dissociable, dissolution-inhibiting groups that contain an aliphatic cyclic group include groups that contain a tertiary carbon atom within the ring skeleton of a cycloalkyl group, and specific examples include a 2-methyladamantyl group and 2-ethyladamantyl group. Other possible groups include those that contain an aliphatic cyclic group such as an adamantyl group, and a branched-chain alkylene group that contains a tertiary carbon atom and is bonded to the aliphatic cyclic group, such as the group shown within the structural unit represented by a general formula shown below.

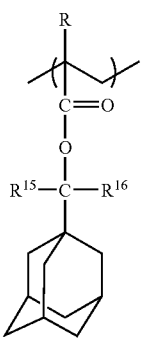

[wherein, R is as defined above, and $R^{15}$ and $R^{16}$ each represent, independently, an alkyl group (which may be either a straight-chain or branched-chain group, and preferably contains from 1 to 5 carbon atoms)]

In the general formula (a1-0-2), R is as defined above. Moreover, $X^2$ is as defined for $X^1$ within the formula (a1-0-1).

$Y^2$ is a bivalent aliphatic cyclic group, and with the exception of restricting the group to bivalent groups, suitable groups include the same groups as those described in relation to $Y^1$ within the general formula (a0), and preferred forms are also as described for $Y^1$.

More specific examples of the structural unit (a1) include the structural units represented by general formulas (a1-1-1) to (a1-4) shown below.

(a1-1)
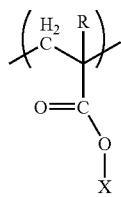

(a1-2)
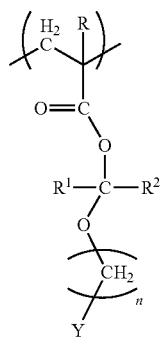

(a1-3)
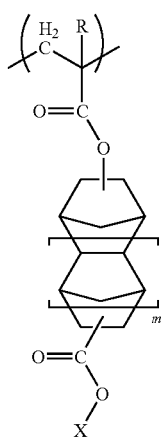

(a1-4)
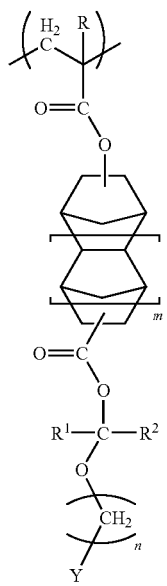

[In the above formulas, X represents a tertiary alkyl ester-based acid-dissociable, dissolution-inhibiting group, Y represents a lower alkyl group of 1 to 5 carbon atoms or an aliphatic cyclic group; n represents either 0 or an integer from 1 to 3; m represents either 0 or 1; and R, $R^1$ and $R^2$ each represent, independently, a hydrogen atom or a lower alkyl group of 1 to 5 carbon atoms.]

Suitable aliphatic cyclic groups for the group Y are as defined above.

X is a tertiary alkyl ester-based acid-dissociable, dissolution-inhibiting group, and is as described above for $X^1$.

At least one of the groups $R^1$ and $R^2$ is preferably a hydrogen atom, and those cases in which both groups are hydrogen atoms are particularly preferred n is preferably either 0 or 1.

Specific examples of structural units represented by the above general formulas (a1-1) to (a1-4) are shown below.

(a1-1-1)
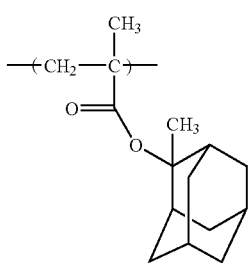

(a1-1-2)
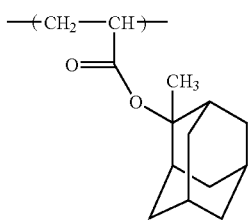

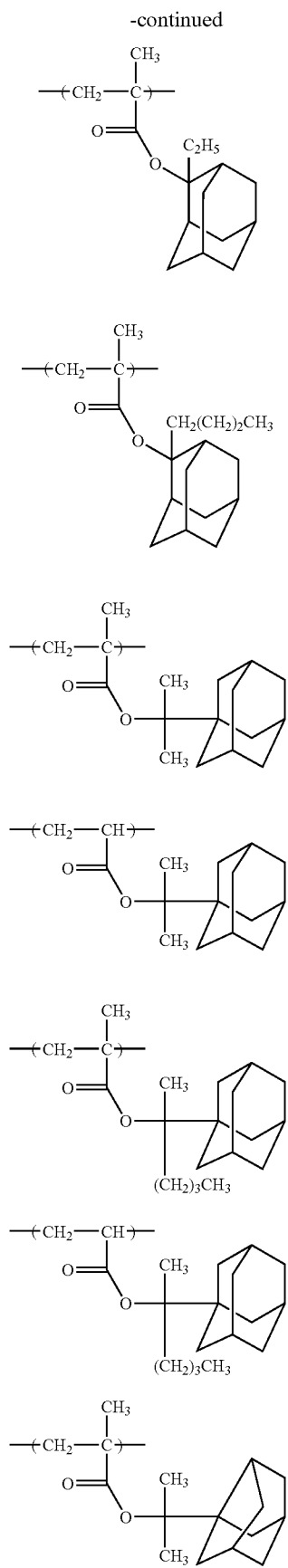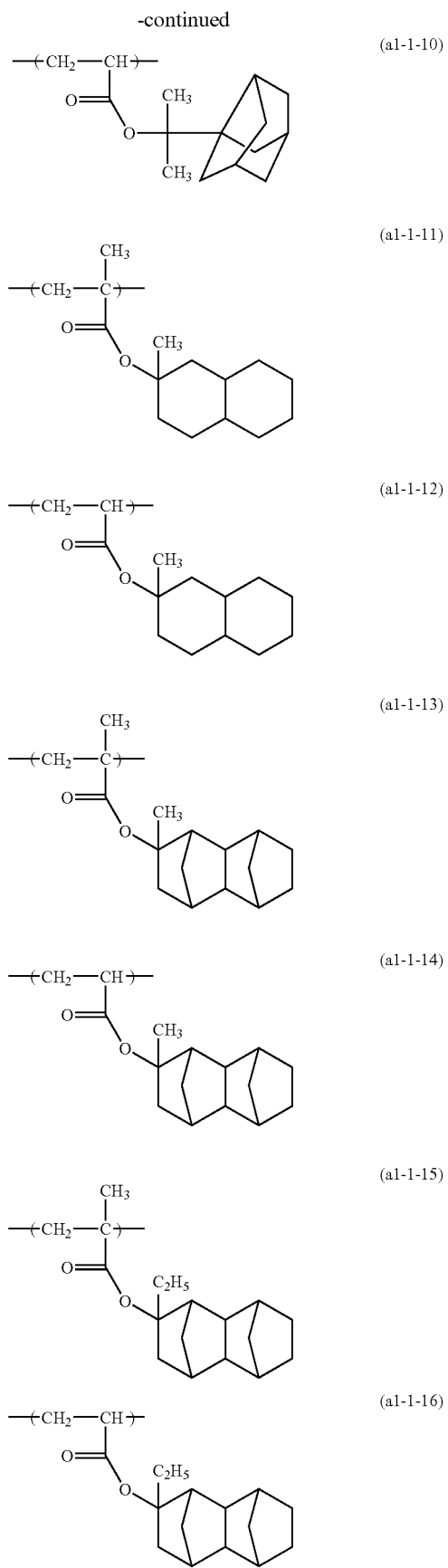

-continued
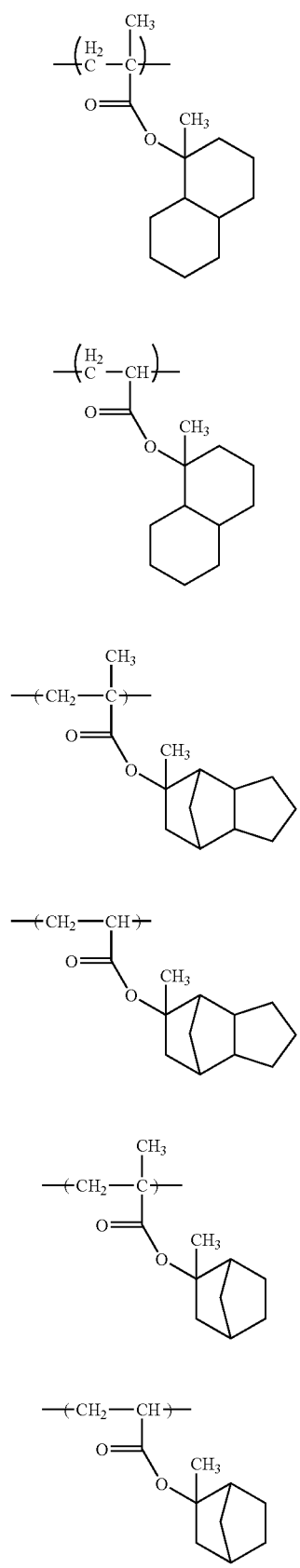
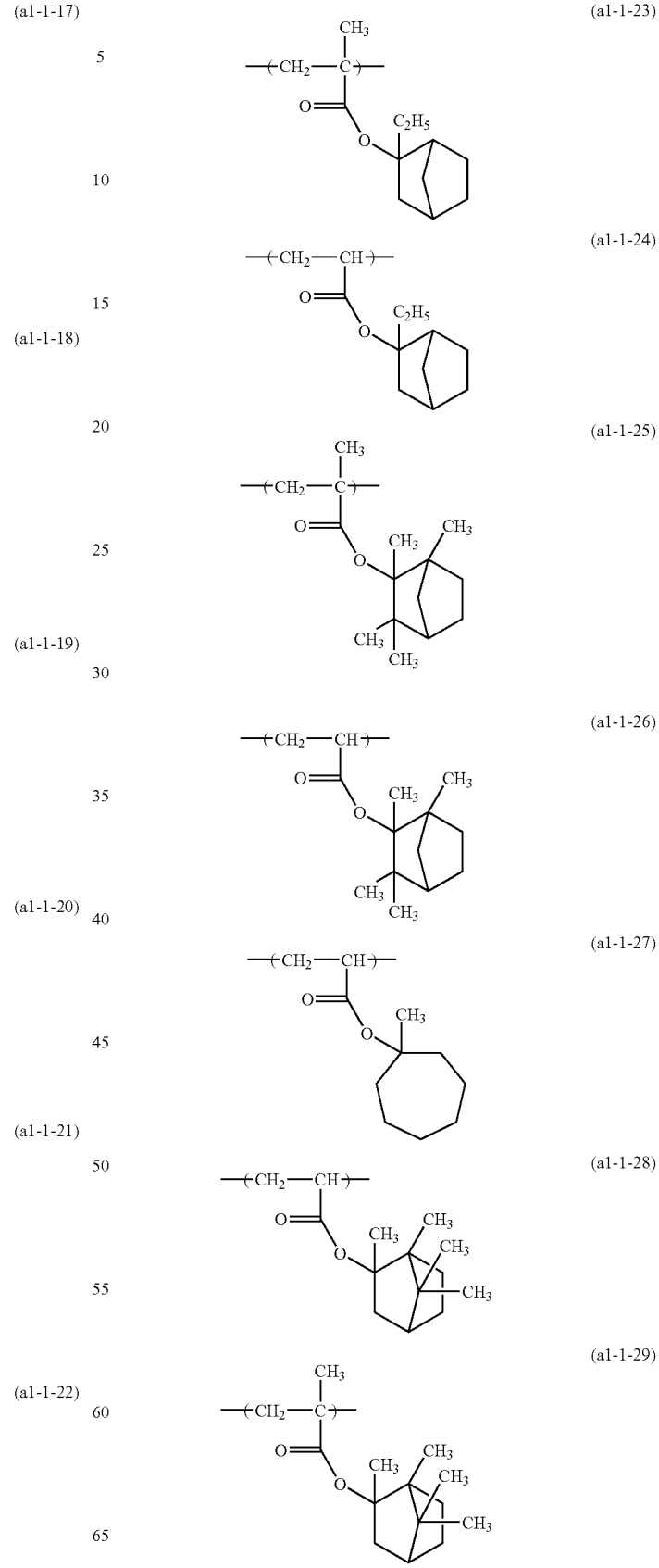

-continued
(a1-1-30)
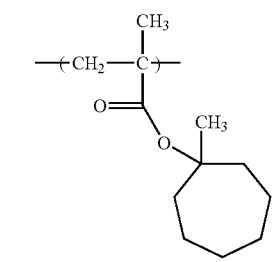
(a1-1-31)
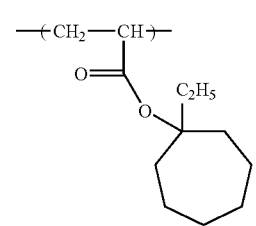
(a1-1-32)
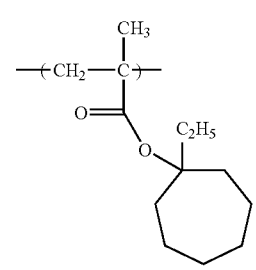
(a1-1-33)
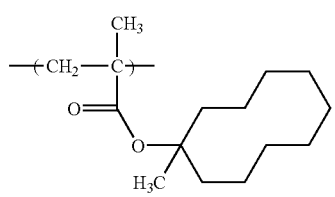
(a-1-1-34)
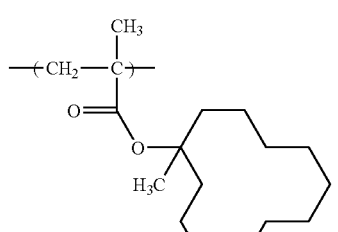
(a1-1-35)
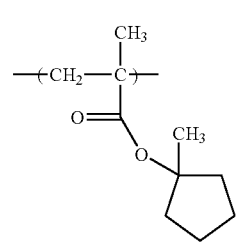
-continued
(a1-1-36)
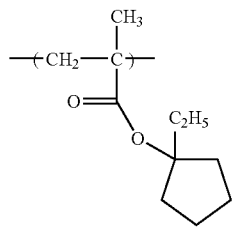
(a1-1-37)
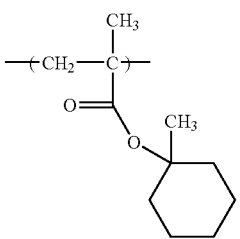
(a1-1-38)
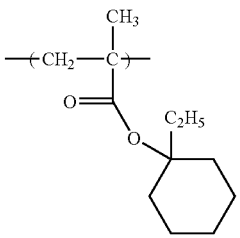
(a1-1-39)
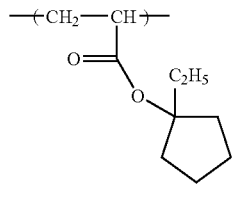
(a1-1-40)
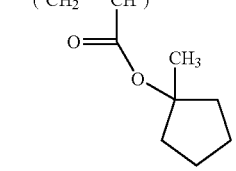
(a1-2-1)
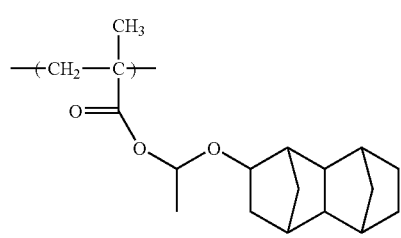
(a1-2-2)
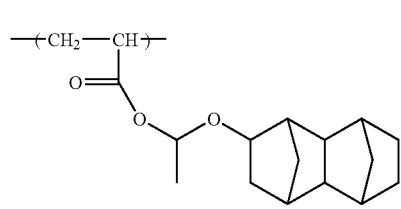

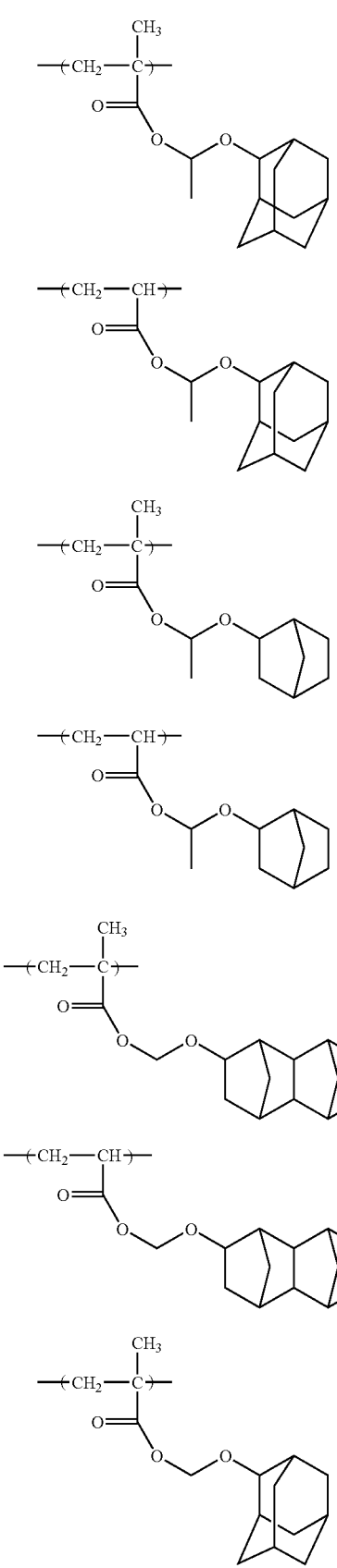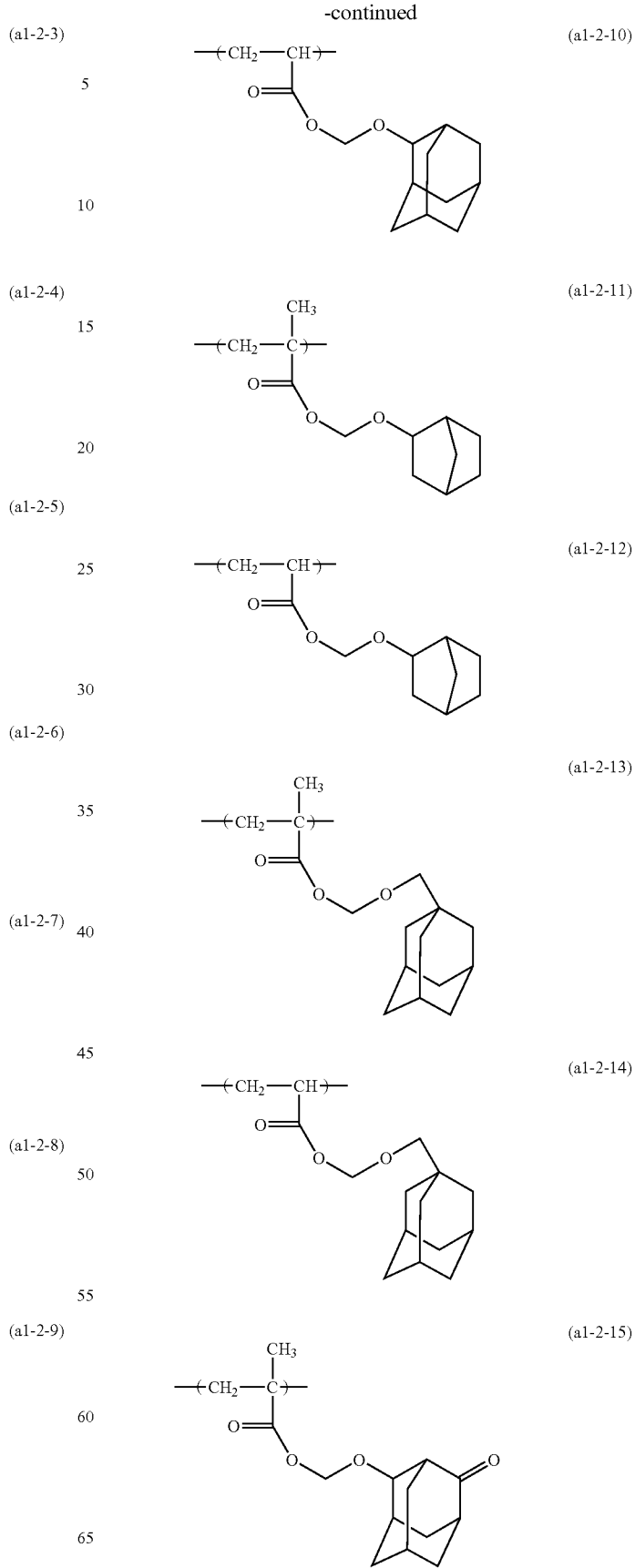

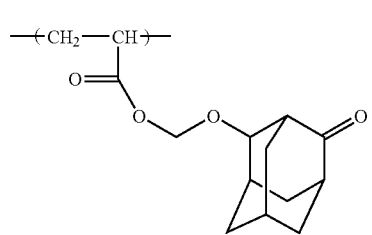 (a1-2-16)
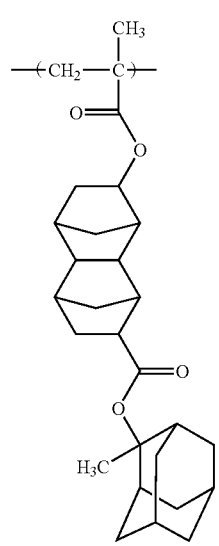 (a1-3-1)
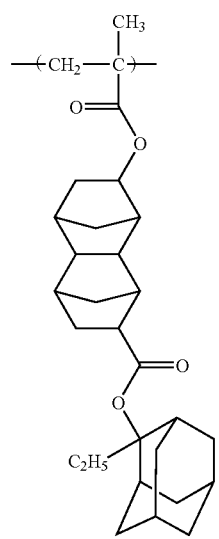 (a1-3-2)
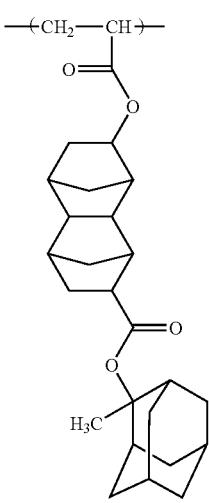 (a1-3-3)
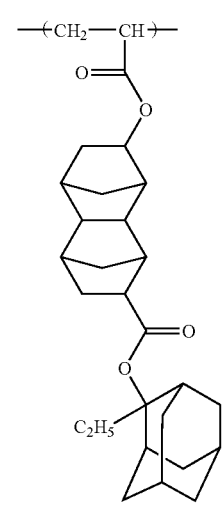 (a1-3-4)
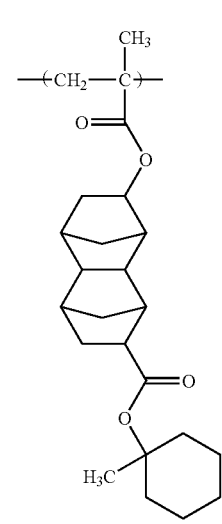 (a1-3-5)

-continued
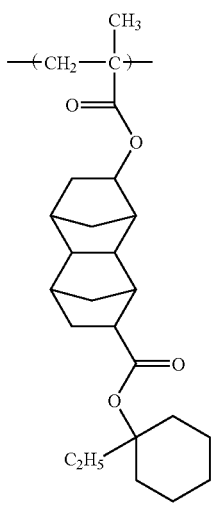 (a1-3-6)
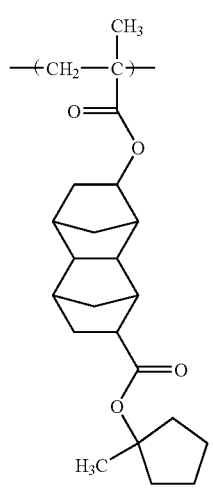 (a1-3-7)
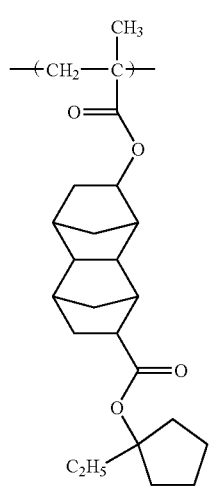 (a1-3-8)
-continued
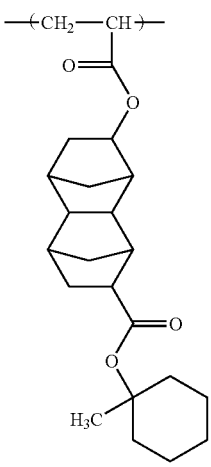 (a1-3-9)
(a1-3-10)
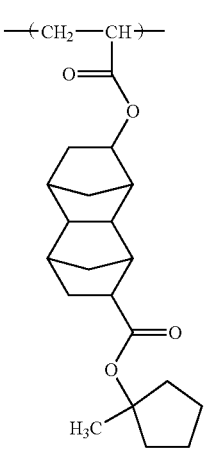 (a1-3-11)

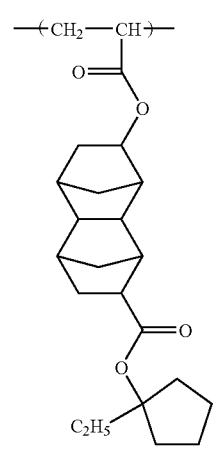
(a1-3-12)
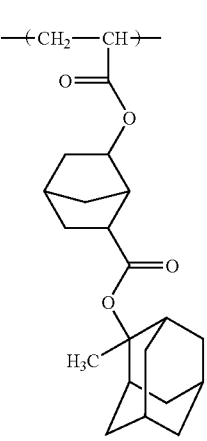
(a1-3-15)
(a1-3-13)
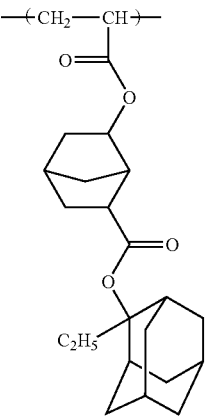
(a1-3-16)
(a1-3-14)
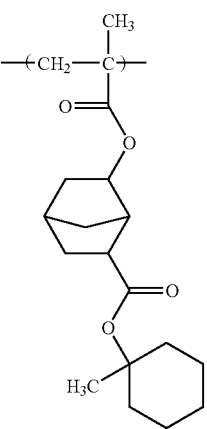
(a1-3-17)

-continued
(a1-3-18)
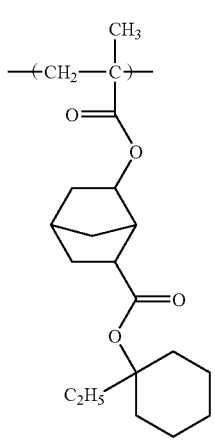
(a1-3-19)
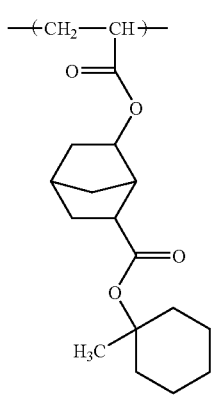
(a1-3-20)
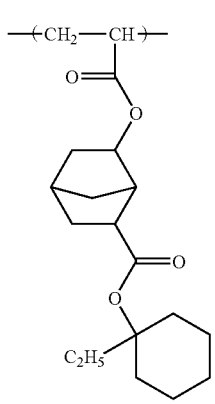
(a1-3-21)
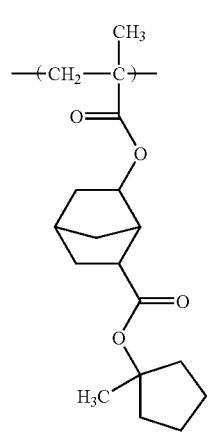
-continued
(a1-3-22)
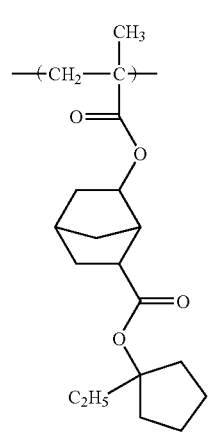
(a1-3-23)
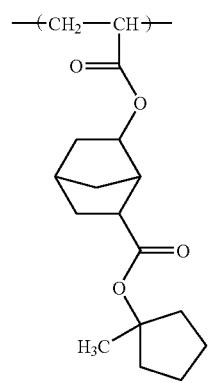
(a1-3-24)
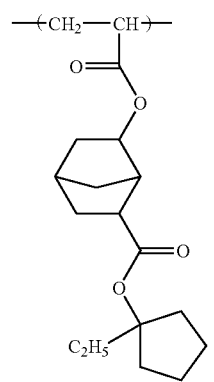
(a1-4-1)
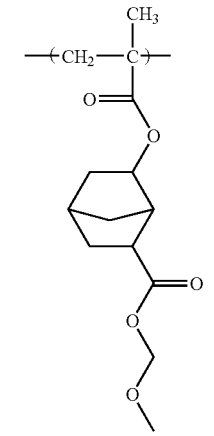

-continued
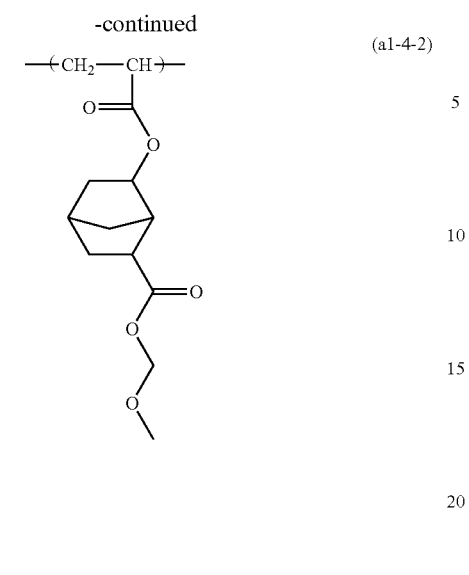
(a1-4-2)
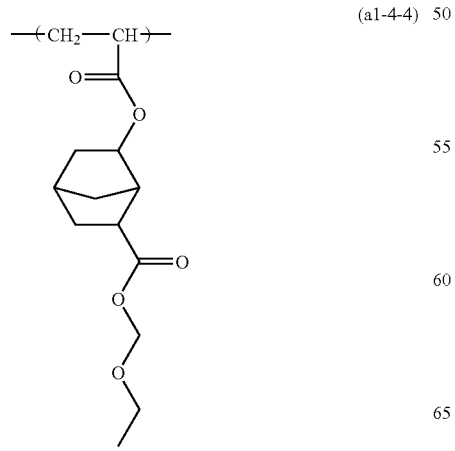
(a1-4-3)
(a1-4-4)
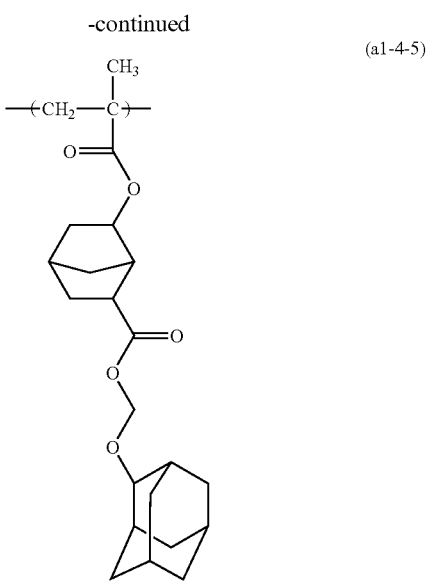
(a1-4-5)
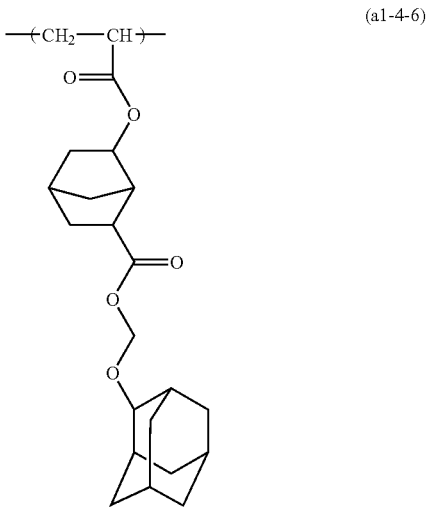
(a1-4-6)
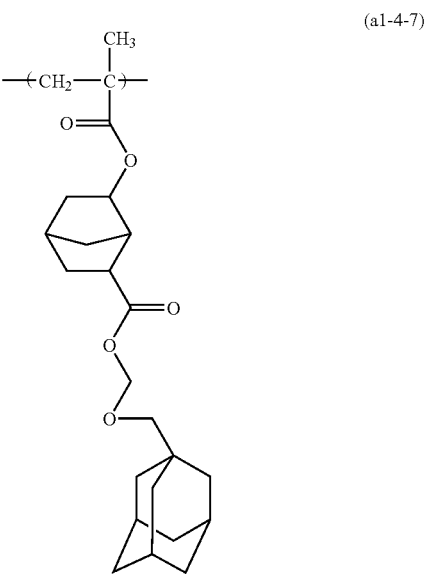
(a1-4-7)

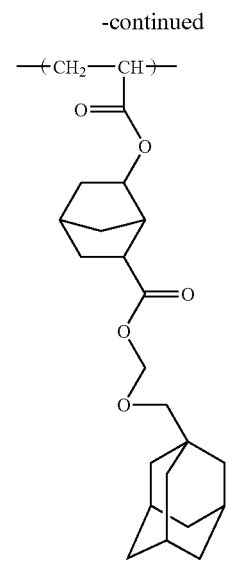
(a1-4-8)
(a1-4-9)
(a1-4-10)
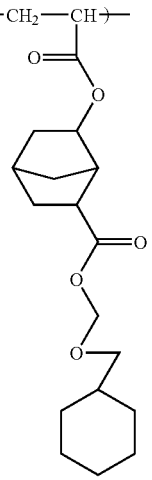
(a1-4-11)
(a1-4-12)
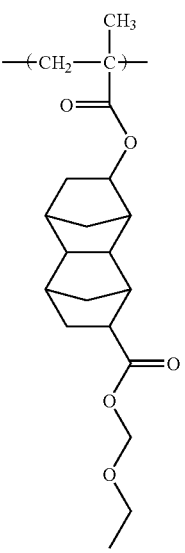
(a1-4-13)

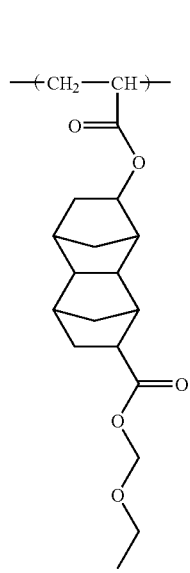
(a1-4-14)
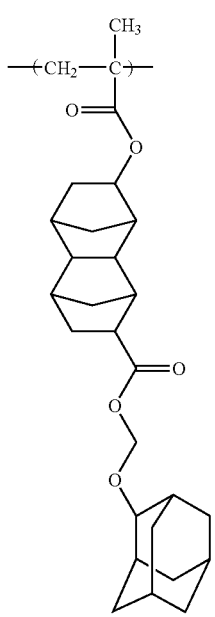
(a1-4-15)
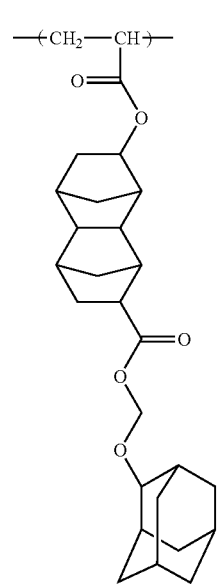
(a1-4-16)
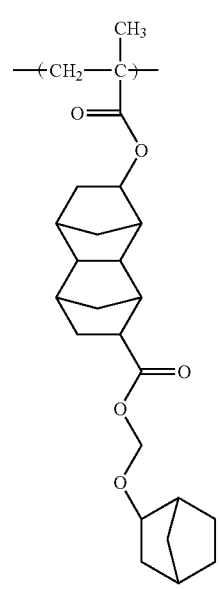
(a1-4-17)

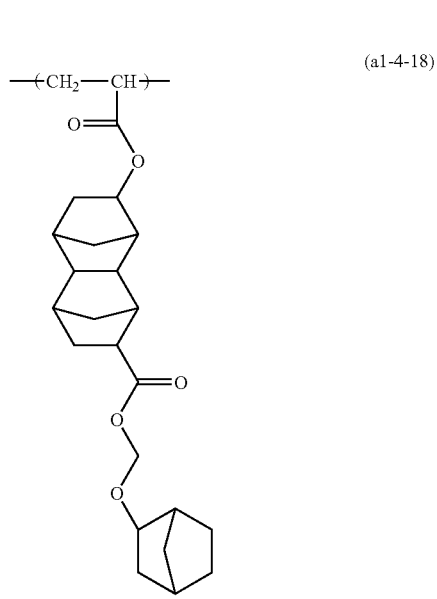
(a1-4-18)
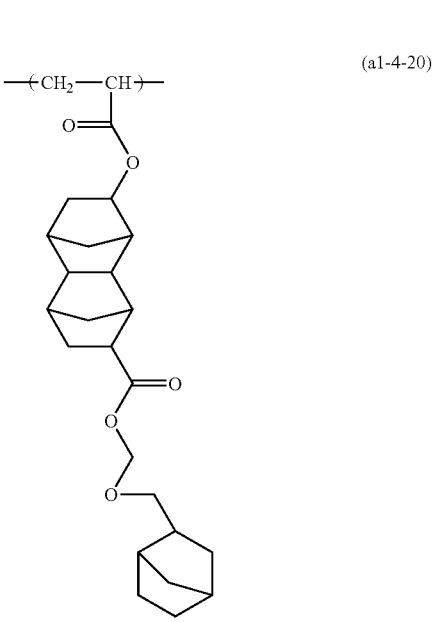
(a1-4-20)
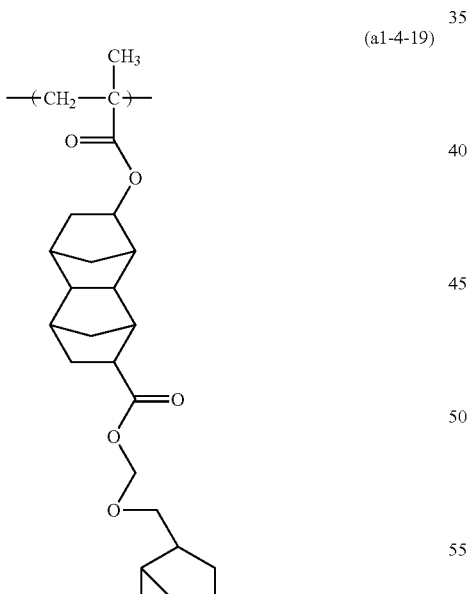
(a1-4-19)
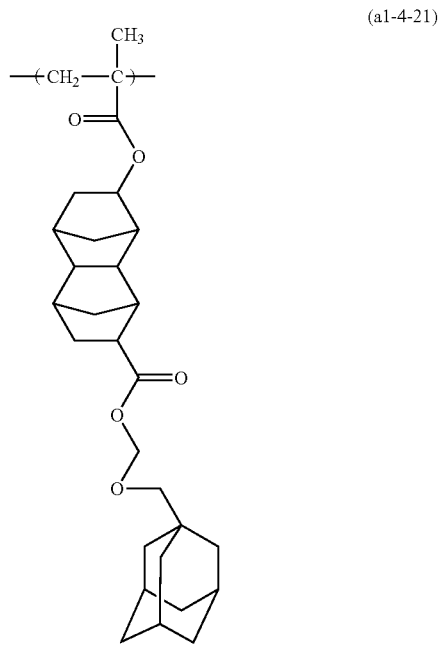
(a1-4-21)

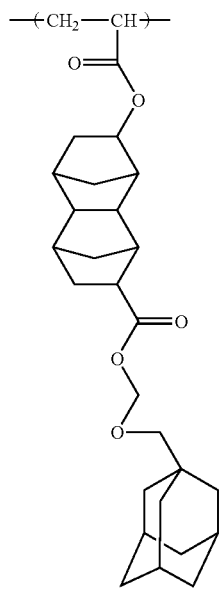
(a1-4-22)
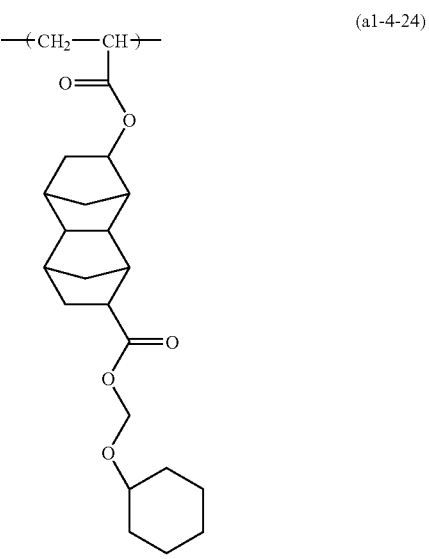
(a1-4-24)
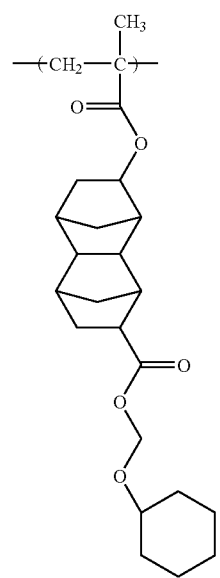
(a1-4-23)
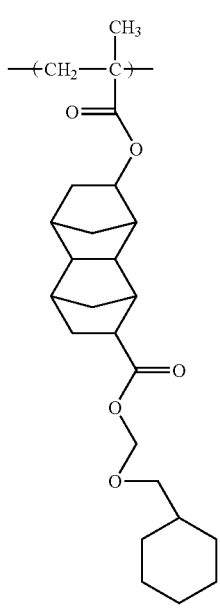
(a1-4-25)

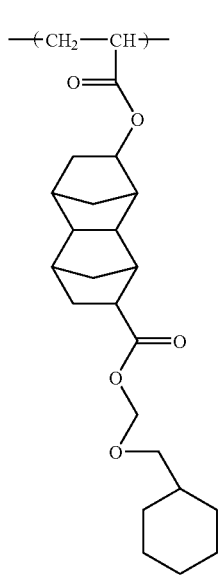

(a1-4-26)

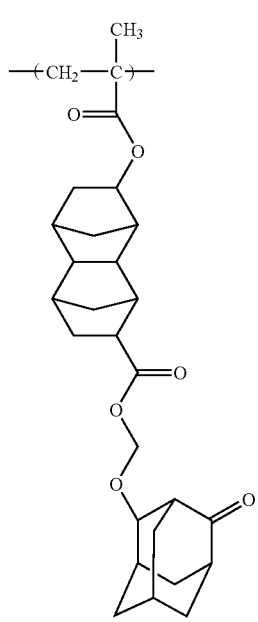

(a1-4-27)

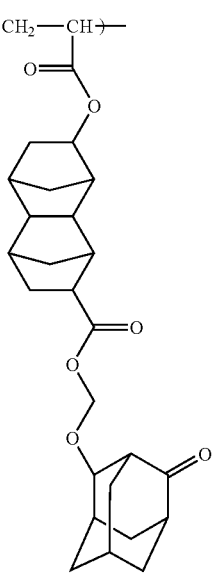

(a1-4-28)

As the structural unit (a1), structural units represented by the general formula (a1-1) are preferred, and structural units represented by the formulas (a1-1-1) to (a1-1-6) are the most desirable.

Furthermore, as the structural unit (a1), structural units of the general formula (a1-1-0) shown below, which includes the structural units of the formulas (a1-1-1) to (a1-1-4), are particularly desirable.

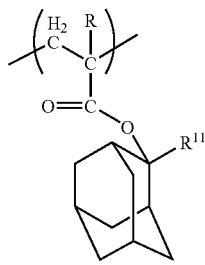

(a1-1-0)

(wherein, R represents a hydrogen atom or a lower alkyl group, and $R^{11}$ represents a lower alkyl group)

R is as defined above. The lower alkyl group represented by $R^{11}$ is the same as the lower alkyl group defined in relation to R, and a methyl group or ethyl group is preferred.

As the structural unit (a1), either a single type of structural unit may be used alone, or a combination of two or more different structural units may be used.

The proportion of the structural unit (a1), relative to the combined total of all the structural units that constitute the polymer compound (A1), is typically within a range from 10 to 80 mol %, preferably from 20 to 60 mol %, and is most preferably from 30 to 50 mol %. Ensuring that this proportion is at least as large as the lower limit of the above range enables a more favorable pattern to be obtained when the polymer is used in a resist composition, whereas ensuring that the proportion is no greater than the upper limit enables a more favorable balance to be achieved with the other structural units.

Structural Unit (a2)

The polymer compound (A1) preferably also includes a structural unit (a2) derived from an (α-lower alkyl) acrylate ester that contains a lactone-containing monocyclic or polycyclic group.

When the polymer compound (A1) is used in forming a resist film, the lactone-containing monocyclic or polycyclic group of the structural unit (a2) is effective in improving the adhesion between the resist film and the substrate, and enhancing the hydrophilicity of the resist film relative to the developing solution.

In this description, the term "lactone-containing monocyclic or polycyclic group" refers to a cyclic group that contains a ring containing a —O—C(O)— structure (namely, a lactone ring). This lactone ring is counted as the first ring, and groups that contain only the lactone ring are referred to as monocyclic groups, whereas groups that also contain other ring structures are described as polycyclic groups regardless of the structure of the other rings.

As the lactone-containing monocyclic or polycyclic group, any group can be used without any particular restrictions, provided it includes the above type of lactone ring.

Specifically, examples of lactone-containing monocyclic groups include groups in which one hydrogen atom has been removed from γ-butyrolactone. Furthermore, examples of lactone-containing polycyclic groups include groups in which one hydrogen atom has been removed from a lactone ring-containing bicycloalkane, tricycloalkane, or tetracycloalkane. Groups obtained by removing one hydrogen atom from a lactone-containing tricycloalkane with a structural formula such as that shown below are particularly preferred in terms of industrial availability.

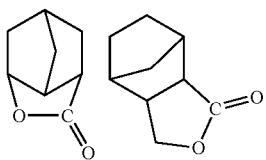

More specific examples of the structural unit (a2) include the structural units represented by the general formulas (a2-1) to (a2-5) shown below.

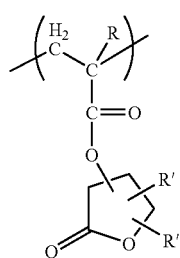
(a2-1)

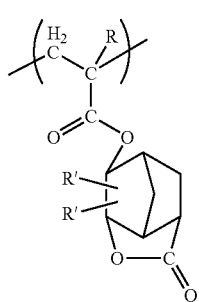
(a2-2)

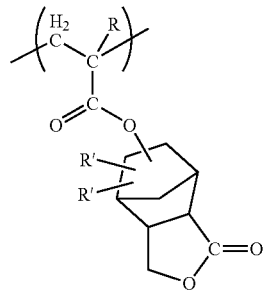
(a2-3)

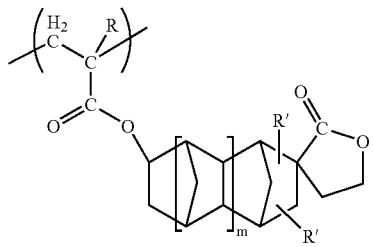
(a2-4)

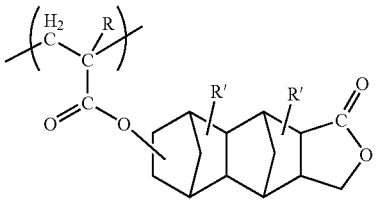
(a2-5)

[wherein, R represents a hydrogen atom or a lower alkyl group, R' represents a hydrogen atom, a lower alkyl group, or an alkoxy group of 1 to 5 carbon atoms, and m represents an integer of 0 or 1]

Examples of the lower alkyl groups of R and R' within the general formulas (a2-1) to (a2-5) include the same lower alkyl groups as those described in relation to the group R within the structural unit (a1).

In the general formulas (a2-1) to (a2-5), considering factors such as industrial availability, R' is preferably a hydrogen atom.

Specific examples of structural units of the general formulas (a2-1) to (a2-5) are shown below.

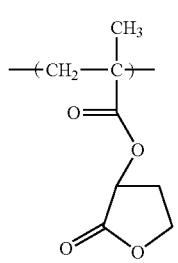
(a2-1-1)

-continued
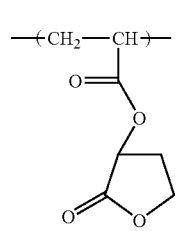 (a2-1-2)
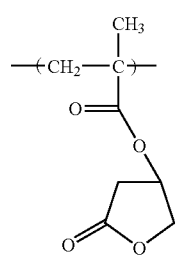 (a2-1-3)
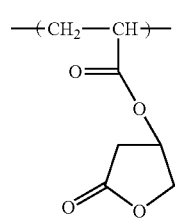 (a2-1-4)
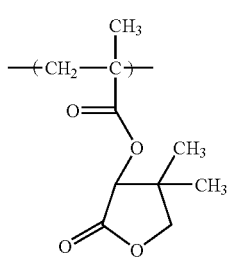 (a2-1-5)
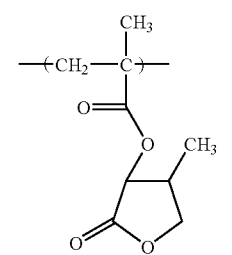 (a2-1-6)
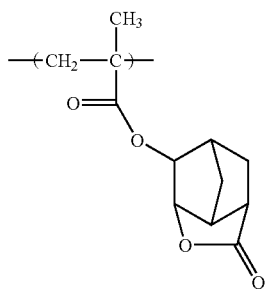 (a2-2-1)
-continued
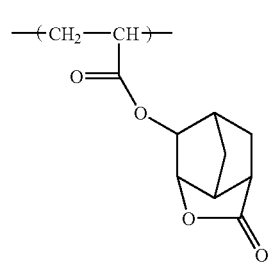 (a2-2-2)
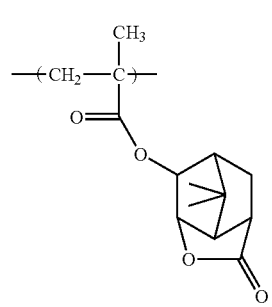 (a2-2-3)
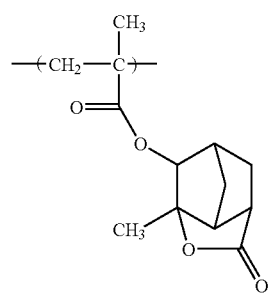 (a2-2-4)
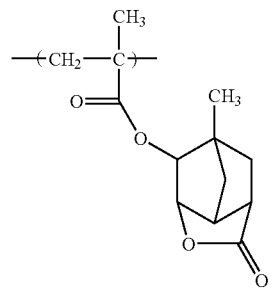 (a2-2-5)
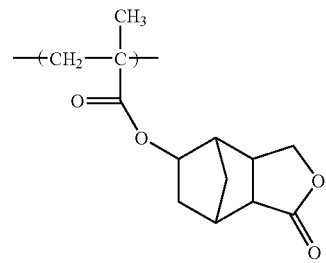 (a2-3-1)
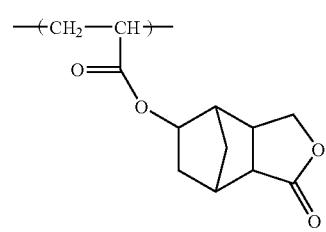 (a2-3-2)

-continued
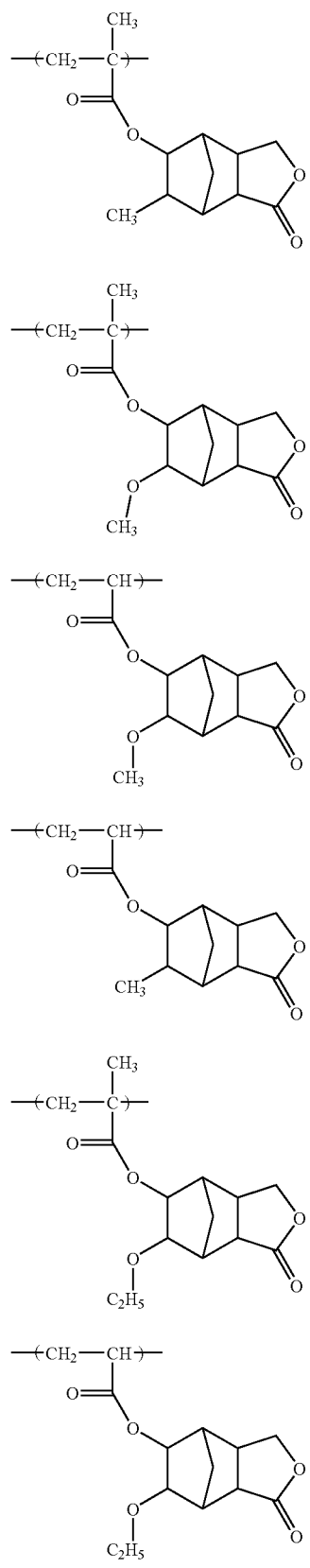
(a2-3-3)
(a2-3-4)
(a2-3-5)
(a2-3-6)
(a2-3-7)
(a2-3-8)
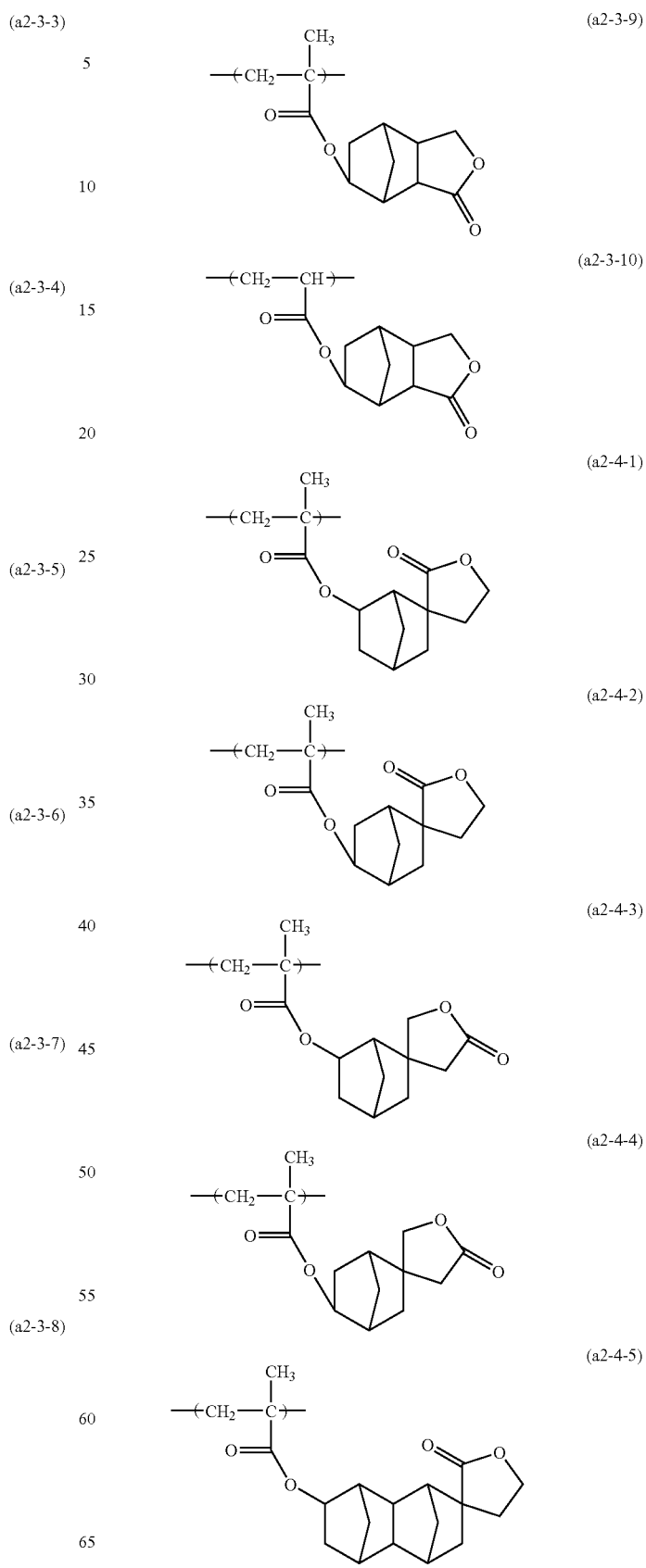
(a2-3-9)
(a2-3-10)
(a2-4-1)
(a2-4-2)
(a2-4-3)
(a2-4-4)
(a2-4-5)

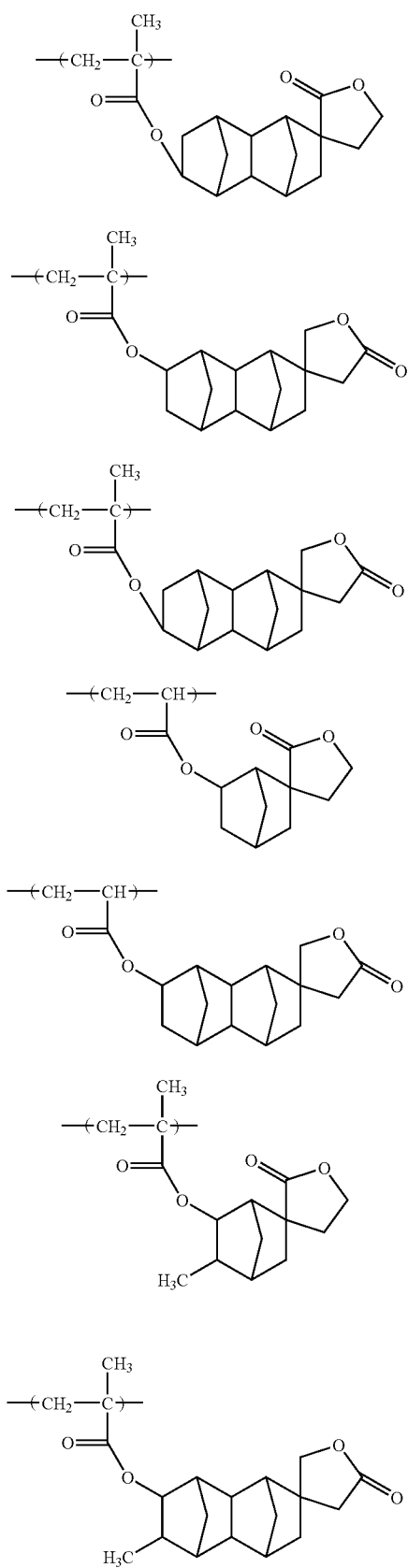
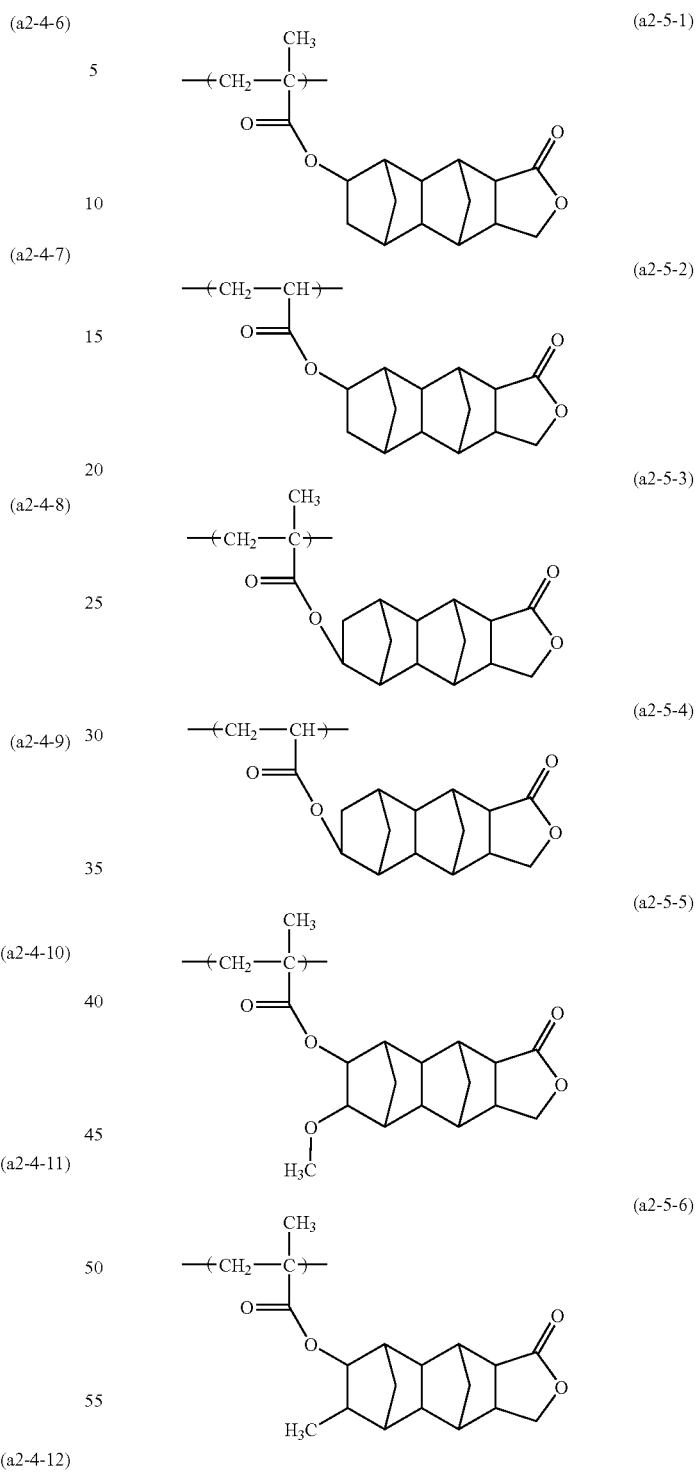

In the general formulas (a2-1) to (a2-5), considering factors such as industrial availability, R' is preferably a hydrogen atom.

Of the above structural units, the use of at least one structural unit selected from units of the general formulas (a2-1) to (a2-5) is preferred, and the use of at least one structural unit selected from units of the general formulas (a2-1) to (a2-3) is even more desirable.

Specifically, the use of at least one structural unit selected from amongst the chemical formulas (a2-1-1), (a2-1-2), (a2-2-1), (a2-2-2), (a2-3-1), (a2-3-2), (a2-3-9), and (a2-3-10) is particularly preferred.

The use of a structural unit represented by the general formula (a2-1) is most preferred, and particularly the use of a structural unit represented by either of the chemical formulas (a2-1-1) and (a2-1-2).

In the polymer compound (A1), as the structural unit (a2), either a single type of structural unit may be used alone, or a combination of two or more different structural units may be used.

The proportion of the structural unit (a2) within the polymer compound (A1), relative to the combined total of all the structural units that constitute the polymer compound (A1), is preferably within a range from 10 to 80 mol %, even more preferably from 20 to 60 mol %, and is most preferably from 30 to 50 mol %. Ensuring that this proportion is at least as large as the lower limit of the above range enables the effects obtained by including the structural unit (a2) to be more readily realized, whereas ensuring that the proportion is no greater than the upper limit enables a more favorable balance to be achieved with the other structural units.

In the present invention, the polymer compound (A1) is preferably a copolymer that includes the structural unit (a0), the structural unit (a1), and the structural unit (a2), and copolymers formed solely from these structural units are particularly preferred.

Structural Unit (a3)

The polymer compound (A1) may also include a structural unit (a3) derived from an (α-lower alkyl) acrylate ester that contains a polar group-containing aliphatic hydrocarbon group. Including the structural unit (a3) enhances the hydrophilicity of the polymer compound (A1), thereby improving the affinity with the developing solution, improving the alkali solubility within the exposed portions of the resist, and contributing to an improvement in the resolution. However, in the present invention, it is considered that the structural unit (a0) incorporates the functions provided by the structural unit (a3), and that a favorable level of resolution can be obtained even if the structural unit (a3) is not included. Furthermore, in terms of achieving favorable effects for the present invention, the blend quantity of the structural unit (a3) is preferably as small as possible.

Examples of the polar group include a hydroxyl group, cyano group, carboxyl group, or a hydroxyalkyl group in which a portion of the hydrogen atoms of the alkyl group have been substituted with fluorine atoms, although a hydroxyl group is particularly preferred.

Examples of the aliphatic hydrocarbon group include straight-chain or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units that include an aliphatic polycyclic group that contains a hydroxyl group, cyano group, carboxyl group or a hydroxyalkyl group in which a portion of the hydrogen atoms of the alkyl group have been substituted with fluorine atoms, and are also derived from an (α-lower alkyl) acrylate ester are particularly preferred. Examples of suitable polycyclic groups include groups in which two or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane. These types of polycyclic groups can be selected appropriately from the multitude of groups proposed for the polymer (resin component) of resist compositions designed for use with ArF excimer lasers. Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the hydrocarbon group within the polar group-containing aliphatic hydrocarbon group is a straight-chain or branched hydrocarbon group of 1 to 10 carbon atoms, the structural unit (a3) is preferably a structural unit derived from the hydroxyethyl ester of the (α-lower alkyl) acrylic acid, whereas when the hydrocarbon group is a polycyclic group, examples of preferred structural units include the structural units represented by a formula (a3-1), the structural units represented by a formula (a3-2), and the structural units represented by a formula (a3-3), all of which are shown below.

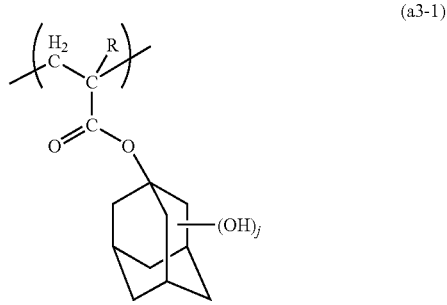

(a3-1)

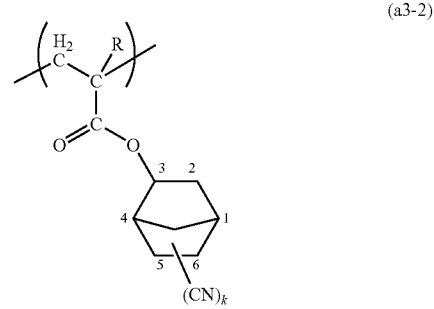

(a3-2)

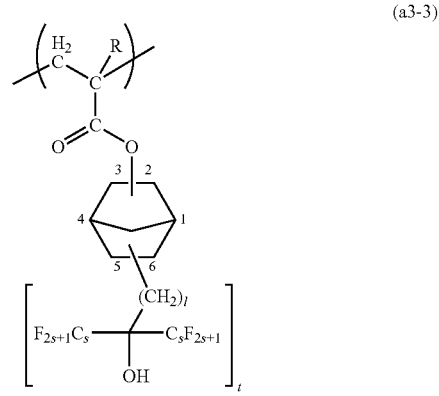

(a3-3)

(wherein, R is as defined above, j represents an integer from 1 to 3, k represents an integer from 1 to 3, t represents an integer from 1 to 3, 1 represents an integer from 1 to 5, and s represents an integer from 1 to 3)

In the formula (a3-1), the value of j is preferably either 1 or 2, and is most preferably 1. In those cases where j is 2, the hydroxyl groups are preferably bonded to position 3 and position 5 of the adamantyl group. In those cases where j is 1, the hydroxyl group is preferably bonded to position 3 of the adamantyl group.

In the formula (a3-2), the value of k is preferably 1. The cyano group is preferably bonded to either position 5 or position 6 of the norbornyl group.

In the formula (a3-3), the value of t is preferably 1. The value of l is also preferably 1. The value of s is also preferably 1. In these units, a 2-norbornyl group or 3-norbornyl group is preferably bonded to the carboxyl group terminal of the (α-lower alkyl) acrylic acid. A fluorinated alkyl alcohol is preferably bonded to either position 5 or 6 of the norbornyl group.

As the structural unit (a3), either a single type of structural unit may be used alone, or a combination of two or more different structural units may be used.

In those cases where the polymer compound (A1) includes a structural unit (a3), the proportion of the structural unit (a3) within the polymer compound (A1), relative to the combined total of all the structural units that constitute the polymer compound (A1), is preferably within a range from 5 to 50 mol %, and even more preferably from 10 to 35 mol %.

Structural Unit (a4)

The polymer compound (A1) may also include other structural units (a4) besides the structural units (a0) to (a3) described above, provided the inclusion of these other units does not impair the effects of the present invention.

As the structural unit (a4), any other structural unit that cannot be classified as one of the above structural units (a0) through (a3) can be used without any particular restrictions, and any of the multitude of conventional structural units used within resist resins for ArF excimer lasers or KrF excimer lasers (and particularly for ArF excimer lasers) can be used.

As the structural unit (a4), a structural unit that contains a non-acid-dissociable aliphatic polycyclic group, and is also derived from an (α-lower alkyl) acrylate ester is preferred. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In particular, at least one group selected from amongst a tricyclodecanyl group, adamantyl group, tetracyclododecanyl group, isobornyl group, and norbornyl group is preferred in terms of factors such as industrial availability.

Specific examples of the structural unit (a4) include units with structures represented by general formulas (a4-1) to (a4-5) shown below.

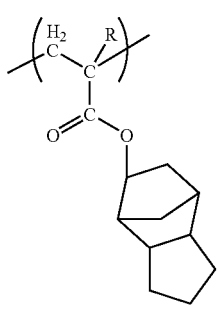

(a4-1)

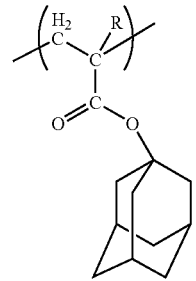

(a4-2)

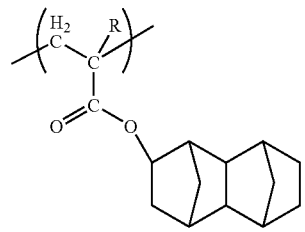

(a4-3)

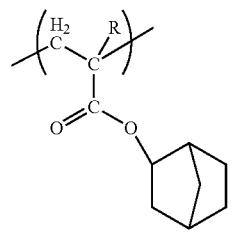

(a4-4)

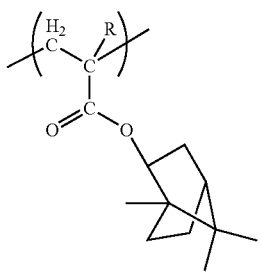

(a4-5)

(wherein, R is as defined above)

Although the structural unit (a4) is not an essential component of the polymer compound (A1), if included within the polymer compound (A1), the proportion of the structural unit (a4), relative to the combined total of all the structural units that constitute the polymer compound (A1), is typically within a range from 1 to 30 mol %, and is preferably from 10 to 20 mol %.

The polymer compound (A1) can be obtained, for example, by a conventional radical polymerization or the like of the monomers corresponding with each of the structural units, using a radical polymerization initiator such as azobisisobutyronitrile (AIBN).

Furthermore, —C(CF$_3$)$_2$—OH groups may be introduced at the terminals of the polymer compound (A1) by also using a chain transfer agent such as HS—CH$_2$—CH$_2$—CH$_2$—C(CF$_3$)$_2$—OH during the above polymerization. A copolymer wherein hydroxyalkyl groups, in which a portion of the hydrogen atoms of the alkyl group have been substituted with fluorine atoms, have been introduced in this manner is effective in reducing the levels of developing defects and LER (line edge roughness: non-uniform irregularities within the line side walls).

Although there are no particular restrictions on the weight average molecular weight (Mw) (the polystyrene equivalent value determined by gel permeation chromatography) of the polymer compound (A1), the molecular weight value is preferably within a range from 3,000 to 50,000, even more preferably from 5,000 to 30,000, and is most preferably from 7,000 to 15,000. Provided the molecular weight is lower than the upper limit of this range, the level of solubility within resist solvents is adequate for use within a resist, whereas provided the molecular weight is larger than the lower limit of the above range, favorable levels of dry etching resistance and resist pattern cross-sectional shape can be obtained.

Furthermore, the polydispersity (Mw/Mn) is preferably within a range from 1.0 to 5.0, and even more preferably from 1.0 to 3.0.

The above ranges also apply to the Mw and polydispersity values for the component (A).

The proportion of the component (A) within a positive resist composition can be adjusted appropriately in accordance with the thickness of the target resist film.

<Component (B)>

There are no particular restrictions on the component (B), and any of the acid generators proposed for use within conventional chemically amplified positive resist compositions can be used. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Specific examples of suitable onium salt-based acid generators include diphenyl)iodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, and tri(4-tert-butyl)phenylsulfonium trifluoromethanesulfonate, heptafluoropropanesulfonate or nonafluorobutanesulfonate.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Furthermore, oxime sulfonate-based acid generators represented by the chemical formulas shown below can also be used.

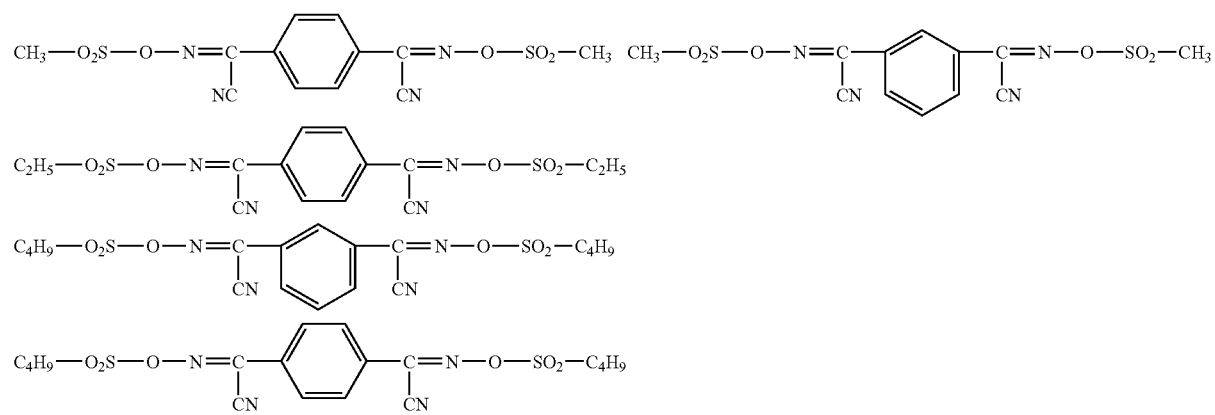

-continued

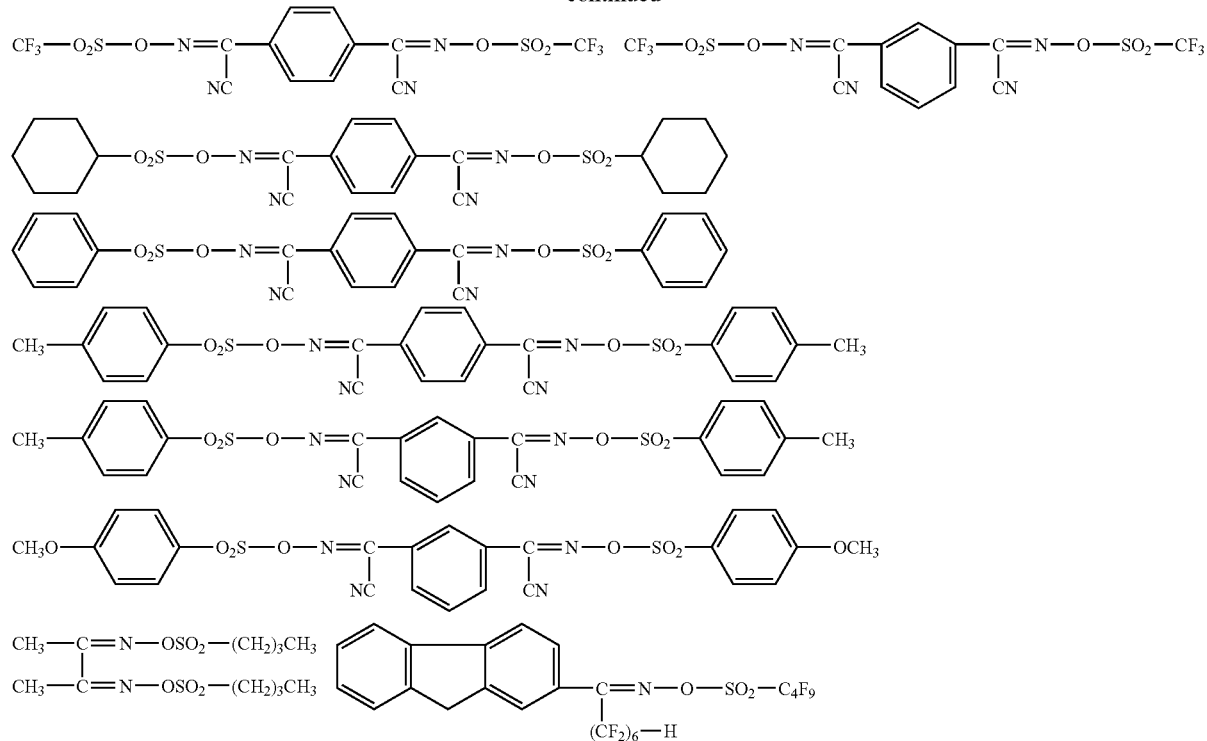

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

Compound A

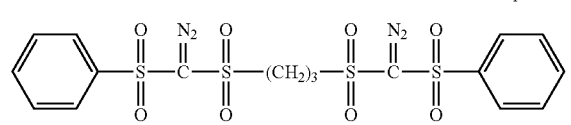

-continued

Compound B

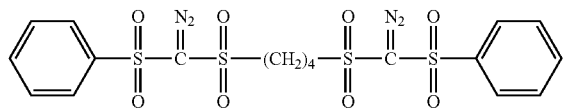

Compound C

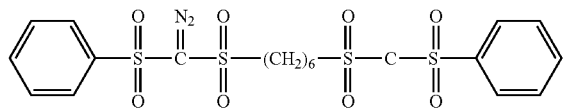

Compound D

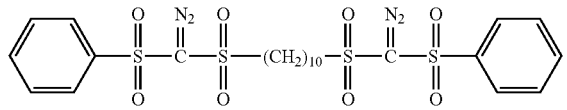

Compound E

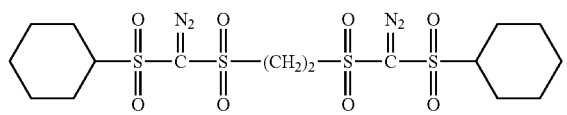

Compound F

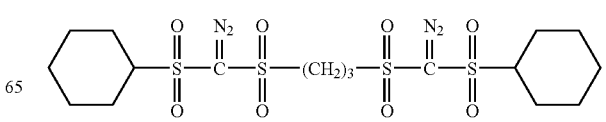

-continued

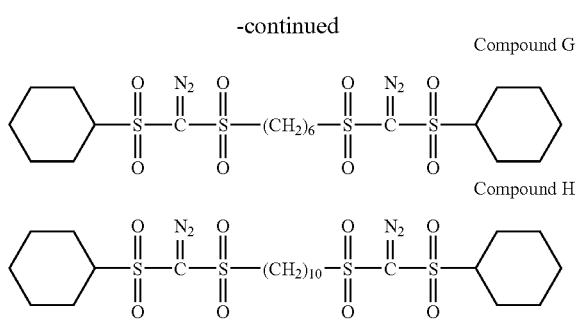

Compound G

Compound H

In the present invention, of the various possibilities, the component (B) is preferably an onium salt containing a fluorinated alkylsulfonate ion as the anion.

As the component (B), either a single acid generator may be used alone, or a combination of two or more different acid generators may be used.

The quantity used of the component (B) is typically within a range from 0.5 to 30 parts by weight, and even more preferably from 1 to 10 parts by weight, per 100 parts by weight of the component (A). Ensuring the quantity satisfies this range enables satisfactory pattern formation to be conducted. Furthermore, a uniform solution is obtained, and the storage stability is also favorable, both of which are desirable.

A positive resist composition of the present invention can be produced by dissolving the aforementioned components (A) and (B), and any of the optional materials described below, in an organic solvent (hereafter also referred to as the component (C)).

The organic solvent of the component (C) may be any solvent capable of dissolving each of the components used to generate a uniform solution, and either one, or two or more solvents selected from known materials used as the solvents for conventional chemically amplified resists can be used.

Suitable examples include lactones such as γ-butyrolactone, ketones such as acetone, methyl ethyl ketone, cyclohexanone, methyl isoamyl ketone and 2-heptanone, polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate, cyclic ethers such as dioxane, and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, a mixed solvent of propylene glycol monomethyl ether acetate (PGMEA) and a polar solvent is preferred. In such cases, the mixing ratio (weight ratio) can be determined on the basis of the co-solubility of the PGMEA and the polar solvent, but is preferably within a range from 1:9 to 9:1, and even more preferably from 2:8 to 8:2.

More specifically, in those cases where EL is added as the polar solvent, the weight ratio of PGMEA:EL is preferably within a range from 1:9 to 9:1, and even more preferably from 2:8 to 8:2.

Furthermore, as the organic solvent, a mixed solvent of at least one of PGMEA and EL, together with γ-butyrolactone is also preferred. In such cases, the mixing ratio is set so that the weight ratio between the former and latter components is preferably within a range from 70:30 to 95:5.

There are no particular restrictions on the quantity used of the component (C), which is set in accordance with the desired film thickness so as to produce a concentration that enables favorable application to a substrate or the like, and is typically sufficient to produce a solid fraction concentration within the resist composition of 2 to 20% by weight, and preferably from 5 to 15% by weight.

In a positive resist composition of the present invention, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds can be used, including monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Of these, secondary aliphatic amines and tertiary aliphatic amines are preferred, and tertiary alkanolamines such as triethanolamine and triisopropanolamine are particularly desirable.

These compounds can be used either alone, or in combinations of two or more different compounds.

The component (D) is typically used in a quantity within a range from 0.01 to 5.0 parts by weight per 100 parts by weight of the component (A).

Furthermore, in a positive resist composition of the present invention, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Other miscible additives can also be added to a positive resist composition of the present invention according to need, and examples include additive resins for improving the performance of the resist film, surfactants for improving the coating properties, dissolution inhibitors, plasticizers, stabilizers, colorants, halation prevention agents, and dyes and the like.

<<Method of Forming Resist Pattern>>

A method of forming a resist pattern according to the present invention can be conducted, for example, in the manner described below.

Namely, a positive resist composition described above is first applied to a substrate such as a silicon wafer using a spinner or the like, a prebake is then conducted under temperature conditions of 80 to 150° C., for a period of 40 to 120 seconds, and preferably for 60 to 90 seconds, and following selective exposure of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the substrate and the applied layer of the positive resist composition.

There are no particular restrictions on the wavelength used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A positive resist composition according to the present invention is particularly effective for use with an ArF excimer laser.

By using a positive resist composition and a method of forming a resist pattern according to the present invention, a reduction in LWR can be achieved. Furthermore, an improvement in the rectangular formability of the cross-sectional shape of the resist pattern can also be achieved. Moreover, the resolution is also favorable.

EXAMPLES

As follows is a description of examples of the present invention, although the scope of the present invention is in no way limited by these examples.

Synthesis Example 1

In a dried flask, 5.8 g of a compound (1), 4.3 g of a compound (2), and 3.8 g of a compound (3) were dissolved in 100 ml of tetrahydrofuran, and 0.5 g of azobisisobutyronitrile was then added. Following refluxing for 6 hours, the reaction solution was added dropwise to 1 L of n-heptane. The precipitated resin was collected by filtration and dried under reduced pressure, yielding a white resin powder. This resin was termed resin 1, and the structural formula for the resin is shown below. The molecular weight (Mw) of the resin 1 was 10,000. The polydispersity (Mw/Mn) was 2.0. Furthermore, measurement of the carbon-13 nuclear magnetic resonance spectrum ($^{13}$C-NMR) revealed a compositional ratio (molar ratio) of $n^1:m^1:l^1=0.4:0.4:0.2$. The chemical formulas of the above compounds (1) to (3) are shown below.

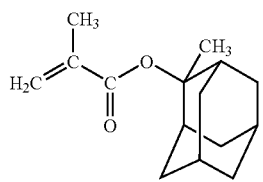

(1)

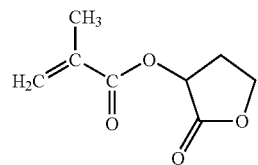

(2)

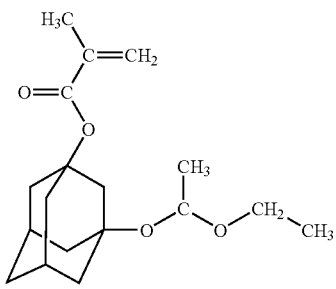

(3)

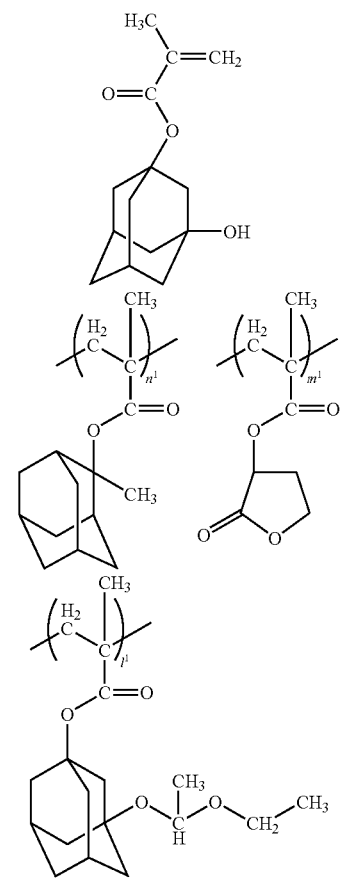

(4)

Comparative Synthesis Example 1

In a dried flask, 18.7 of the compound (1), 13.6 g of the compound (2), and 9.5 g of a compound (4) represented by the chemical formula shown above were dissolved in 200 ml of tetrahydrofuran, and 1.64 g of azobisisobutyronitrile was then added. Following refluxing for 6 hours, the reaction solution was added dropwise to 1 L of n-heptane. The precipitated resin was collected by filtration and dried under reduced pressure, yielding a white resin powder. This resin was termed comparative resin 1, and the structural formula for the resin is shown below. The weight average molecular weight (Mw) of the comparative resin 1 was 10,000, and the polydispersity (Mw/Mn) was 2.0. Furthermore, measurement of the carbon-13 nuclear magnetic resonance spectrum ($^{13}$C-NMR) revealed a compositional ratio (molar ratio) between each of the structural units shown in the structural formula below of m:n:l=0.4:0.4:0.2.

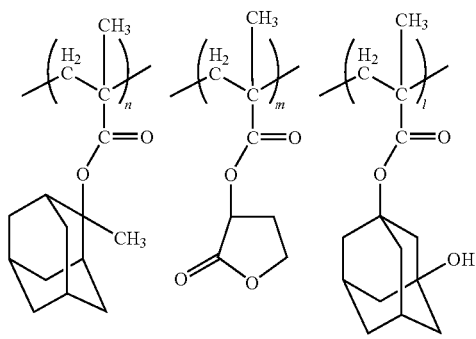

Example 1

The component materials described below were mixed together to form a positive resist composition.

Component (A): 100 parts by weight of the resin 1.

Component (B): a mixture of 2.0 parts by weight of the compound represented by a chemical formula (b1) shown below, and 0.8 parts by weight of the compound represented by a chemical formula (b2) shown below.

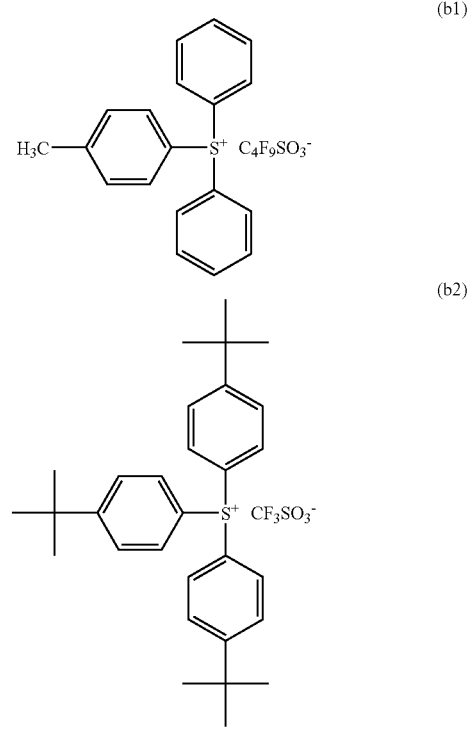

Component (C): 900 parts by weight of a mixed solvent of PGMEA/EL=8/2 (weight ratio), and 25 parts by weight of γ-butyrolactone.

Component (D): 0.25 parts by weight of triethanolamine.

Subsequently, the following evaluations were conducted.

(LWR)

An organic anti-reflective film material (product name: ARC-29A, manufactured by Brewer Science Ltd.) was applied to the surface of an 8-inch silicon wafer, and the material was then baked at 225° C. for 60 seconds, thereby forming an anti-reflective film with a film thickness of 77 nm, and completing preparation of a substrate.

The positive resist composition prepared above was then applied uniformly to the surface of this substrate using a spinner, and was then prebaked and dried on a hotplate at 120° C. for 60 seconds, thereby forming a resist layer with a film thickness of 270 nm. The thus obtained resist layer was then selectively exposed through a binary mask, using an ArF exposure apparatus (wavelength: 193 nm) NSR-S302 (manufactured by Nikon Corporation, NA (numerical aperture)=0.60, 2/3 annular illumination).

A PEB treatment was then conducted at 120° C. for 60 seconds, and the resist film was subjected to puddle development for 60 seconds at 23° C. in a developing solution (a 2.38% by weight aqueous solution of tetramethylammonium hydroxide), and was then rinsed for 30 seconds with pure water and shaken dry, completing formation of a 120 nm line and space (1:1) resist pattern. The sensitivity was 29 mJ/cm$^2$.

Subsequently, the line width of the resist pattern was measured at 5 locations along the line direction using a measuring SEM (product name: S-9220, manufactured by Hitachi, Ltd.), and the results of these measurements were used to calculate a value of 3 times the standard deviation s (namely, 3s), which was used as an indicator of the LWR. The smaller this 3s value becomes, the lower the level of roughness in the line width, indicating a resist pattern with a more uniform width. The value of 3s in this example was 5.2 nm.

(Evaluation of the Cross-Sectional Shape)

When the thus obtained resist pattern was inspected from above using a scanning electron microscope (SEM), the width of the white bands generated along the edge portions parallel to the lengthwise direction of the pattern was extremely small. The size of the width of these white bands tends to increase as the rectangular formability of the cross-sectional shape deteriorates, and as the top edges of the pattern become rounded.

Furthermore, inspection of the cross-sectional shape of the resist pattern using the scanning electron microscope (SEM) revealed a favorable rectangular shape.

Comparative Example 1

With the exception of altering the base resin component from the component (A) to the resin described below, a positive resist composition was produced in the same manner as the example 1.

Resin component: 100 parts by weight of the comparative resin 1.

Subsequently, with the exception of altering the temperatures of the prebake and PEB treatments to 130° C., evaluations were conducted in the same manner as the example 1. The sensitivity upon formation of a 120 nm line and space (1:1) resist pattern was 29 mJ/cm$^2$.

Furthermore, the value of 3s was 6.5 nm.

In terms of the pattern shape, when inspected from above, the width of the white bands was greater than that observed in the example 1. Moreover, the cross-sectional shape exhibited rounding of the top edges.

As is evident from the above results, the example according to the present invention enabled an effective reduction in the level of LWR. Furthermore, it is also clear that the white bands were narrow, and the rectangular formability of the cross-sectional shape of the resist pattern was favorable.

INDUSTRIAL APPLICABILITY

A positive resist composition and a method of forming a resist pattern that enable a reduction in the level of LWR can be obtained.

The invention claimed is:

1. A positive resist composition, comprising:
a resin component (A) that exhibits changed alkali solubility under action of acid; and
an acid generator component (B), wherein
said component (A) includes a polymer compound (A1) having a structural unit (a0) represented by a general formula (a0) shown below, and a structural unit (a1), which is derived from an (α-lower alkyl) acrylate ester containing an acid-dissociable, dissolution-inhibiting group and is not classified as the structural unit (a0):

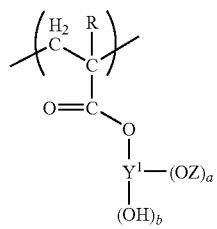

(a0)

(wherein, R represents a hydrogen atom or a lower alkyl group; $Y^1$ represents an aliphatic cyclic group; Z represents an alkoxyalkyl group; a represents an integer from 1 to 3, and b represents either 0 or an integer from 1 to 2, provided that a+b=1 to 3).

2. A positive resist composition according to claim 1, wherein said structural unit (a1) is one or more structural units selected from the group consisting of structural units represented by a general formula (a1-0-1) shown below, and structural units represented by a general formula (a1-0-2) shown below:

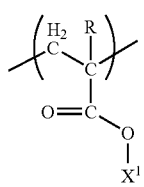

(a1-0-1)

(wherein, R represents a hydrogen atom or a lower alkyl group; and $X^1$ represents an acid-dissociable, dissolution-inhibiting group)

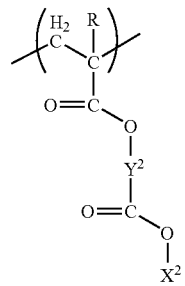

(a1-0-2)

(wherein, R represents a hydrogen atom or a lower alkyl group; $X^2$ represents an acid-dissociable, dissolution-inhibiting group; and $Y^2$ represents an aliphatic cyclic group).

3. A positive resist composition according to claim 1, wherein said structural unit (a1) is represented by a general formula (a1-1-0) shown below:

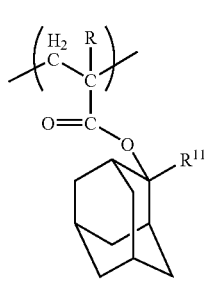

(a1-1-0)

(wherein, R represents a hydrogen atom or a lower alkyl group, and $R^{11}$ represents a lower alkyl group).

4. A positive resist composition according to claim 1, wherein said structural unit (a0) is represented by a general formula (a0-1) shown below:

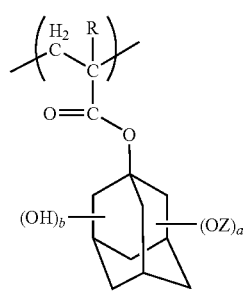

(a0-1)

(wherein, R represents a hydrogen atom or a lower alkyl group, Z represents an alkoxyalkyl group, a represents an integer from 1 to 3, and b represents either 0 or an integer from 1 to 2, provided that a+b=1 to 3).

5. A positive resist composition according to claim 1, wherein said polymer compound (A1) further includes a structural unit (a2) derived from an (α-lower alkyl) acrylate ester that contains a lactone-containing monocyclic or polycyclic group.

6. A positive resist composition according to claim 5, wherein said structural unit (a2) is represented by a general formula (a2-1) shown below:

(a2-1)

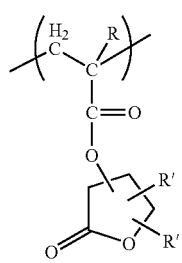

(wherein, R and R' each represent, independently, a hydrogen atom or a lower alkyl group, and said two R' groups may be either different or identical).

7. A positive resist composition according to claim 1, further comprising: a nitrogen-containing organic compound (D).

8. A method of forming a resist pattern, comprising:
applying a positive resist composition according to any one of claim 1 through claim 7 to a substrate;
conducting a prebake;
performing selective exposure;
conducting PEB (post exposure baking); and
performing alkali developing to form a resist pattern.

\* \* \* \* \*